(12) United States Patent
Nakamura et al.

(10) Patent No.: US 7,049,212 B2
(45) Date of Patent: May 23, 2006

(54) METHOD FOR PRODUCING III-IV GROUP COMPOUND SEMICONDUCTOR LAYER, METHOD FOR PRODUCING SEMICONDUCTOR LIGHT EMITTING ELEMENT, AND VAPOR PHASE GROWING APPARATUS

(75) Inventors: Junichi Nakamura, Kashiba (JP); Kazuaki Sasaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/753,290

(22) Filed: Jan. 7, 2004

(65) Prior Publication Data

US 2004/0142550 A1    Jul. 22, 2004

(30) Foreign Application Priority Data

Jan. 8, 2003    (JP) .............................. 2003-002614

(51) Int. Cl.
*H01L 21/44* (2006.01)
(52) U.S. Cl. .................... 438/608; 257/200; 117/89
(58) Field of Classification Search ............ 117/84–89; 438/29–32, 602–609; 257/184–190, 200, 257/201
See application file for complete search history.

(56) References Cited

U.S. PATENT DOCUMENTS 5,438,951 A * 8/1995 Tachikawa et al. ........... 117/84
5,498,568 A * 3/1996 Hosoba et al. ............... 117/89

FOREIGN PATENT DOCUMENTS

| JP | 06-244122 | 9/1994 |
| JP | 08-203837 | 8/1996 |
| JP | 2000-216496 | 8/2000 |

* cited by examiner

*Primary Examiner*—David Nelms
*Assistant Examiner*—Calvin Lee
(74) *Attorney, Agent, or Firm*—Morrison & Foerster LLP

(57) ABSTRACT

A method for producing a III-V group compound semiconductor layer comprises the steps of: forming a first III-V group compound semiconductor layer on a substrate in a reaction chamber; and supplying a III group material gas to the reaction chamber before or after the step of forming the first III-V group compound semiconductor layer to prevent re-evaporation of the III group gas in the reaction chamber.

23 Claims, 11 Drawing Sheets

METHOD FOR PRODUCING III-IV GROUP COMPOUND SEMICONDUCTOR LAYER, METHOD FOR PRODUCING SEMICONDUCTOR LIGHT EMITTING ELEMENT, AND VAPOR PHASE GROWING APPARATUS

BACKGROUND OF THE INVENTION

1. Field of the Invention

The present invention relates to a method for producing a III-IV group compound semiconductor layer, a method for producing a semiconductor light emitting element and a vapor phase growing apparatus.

2. Description of the Related Art

Conventionally, as a method for growing III-IV group compound semiconductor crystals having less crystal defects on a GaAs substrate, Japanese Laid-Open Publication No. 8-203837 describes a following method.

FIG. 9 is a diagram showing a pattern in substrate temperature and material gas introduction during the growth over time in a conventional method for producing a III-IV group compound semiconductor layer disclosed in Japanese Laid-Open Publication No. 8-203837.

First, a GaAs substrate is placed in a reaction container (reaction chamber). The atmosphere in the reaction container is reduced to desirable pressure. Then, as the V group material gas, $AsH_3$ (arsine) is introduced into the reaction container. Next, substrate temperature of the GaAs substrate is increased to 650° C. TMG(trimethyl gallium) is introduced to the reaction container as III group material gas to grow a GaAs buffer layer on the GaAs substrate. Then, supply of TMG to the reaction container is stopped and the growth of the GaAs buffer layer is stopped. At the same time as the supply of the $AsH_3$ is stopped, introduction of $PH_3$ (phosphine) as a V group material is started. After a predetermined time period, TMG, TMA (trimethyl aluminum), and TMI (trimethyl indium) are supplied to the reaction container as III group material gases to start the growth of a AlGaInP layer. During the growth process, the substrate temperature of the GaAs substrate is increased to 750° C. With the substrate temperature of the GaAs substrate maintained at 750° C., the AlGaInP layer is grown until it has a predetermined thickness.

In the conventional method for producing a III-IV group compound semiconductor layer disclosed in Japanese Laid-Open Publication No. 8-20387, switching from $AsH_3$ to $PH_3$ is performed at a substrate temperature lower than a preferable growth temperature for the AlGaInP. The reason is as described below.

When $AsH_3$ is absent at high substrate temperature, As tends to dissociate from GaAs crystal. Thus, if switching from $AsH_3$ to $PH_3$ is performed at high substrate temperature, As atoms dissociate immediately after the switching to $PH_3$. These may cause crystal defects. If the supply of TMG, TMA, and TMI is started in a short time after the switching to $PH_3$ in order to suppress the dissociation of As atoms so as to grow AlGaInP, gases cannot be fully exchanged from $AsH_3$ to $PH_3$ in the reaction container. Thus, As atoms are mixed in AlGaInP. These may cause crystal defects.

Therefore, in the conventional technique disclosed in Japanese Laid-Open Publication No. 8-20387, the gas is switched from $AsH_3$ to $PH_3$ at low substrate temperature. Thus, As leakage immediately after the switching from $AsH_3$ to $PH_3$ or As atom insertion into AlGaInP can be suppressed compared to the case of switching at the preferable growth temperature for the AlGaInP. As a result, it becomes possible to obtain crystals having good quality.

As another example of a method for growing III-IV group compound semiconductor crystals having less crystal defects on a GaAs substrate, Japanese Laid-Open Publication No. 2000-216496 describes a following method.

FIG. 10 is a diagram showing a pattern in substrate temperature and material gas introduction during the growth over time in a conventional method for producing a III-IV group compound semiconductor layer disclosed in Japanese Laid-Open Publication No. 2000-216496.

First, a n-GaAs substrate is placed in a reaction container. The atmosphere in the reaction container is reduced to desirable pressure. Then, as the V group material gas, $AsH_3$ is introduced into the reaction container.

Next, the first GaAs substrate is heated until the substrate temperature is increased to 770–830° C., a first temperature at which n-GaAs buffer layer is to be grown.

Then, with the substrate temperature maintained at the first temperature, TMG is introduced to the reaction container as III group material gas to grow a first n-GaAs buffer layer on the n-GaAs substrate until it has a predetermined thickness. Then, supply of TMG to the reaction container is stopped and the growth of the first n-GaAs buffer layer is stopped.

Further, the substrate temperature is reduced to a second temperature, 680° C. TMG is supplied into the reaction container to grow a second n-GaAs buffer layer.

Then, V group material gas is switched from $AsH_3$ to $PH_3$. After 10 seconds, TMG, TMA, and TMI are supplied to the reaction container as III group material gases to start the growth of a AlGaInP layer. During the growth process, the substrate temperature of the GaAs substrate is increased to 760° C. With the substrate temperature of the GaAs substrate maintained at 760° C., the AlGaInP layer is grown until it has a predetermined thickness.

In the conventional method for producing a III-IV group compound semiconductor layer disclosed in Japanese Laid-Open Publication No. 2000-216496, the first n-GaAs buffer layer is grown at a substrate temperature higher than the preferable growth temperature for the AlGaInP. The reason is as described below.

By growing the first n-GaAs buffer layer at a higher substrate temperature prior to the growth of AlGaInP, oxygen attached to substrate holding member(s) and the like can be evaporated during the growth of the first n-GaAs buffer layer. Since the second n-GaAs buffer layer and the AlGaInP layer are grown at a substrate temperature lower than the first n-GaAs buffer layer, no oxygen evaporates from the substrate holding member(s) and the like.

Therefore, according to the conventional technique disclosed in Japanese Laid-Open Publication No. 2000-216496, it is possible to obtain AlGaInP crystals forming a nonluminous recombination center as AlGaInP crystals having good quality with less oxygen mixed therein.

Further, Japanese Laid-Open Publication No. 6-244122 discloses a method for growing a GaAs buffer layer on an Si substrate. In the method, GaAs layer is grown even during a temperature increasing step, in which the substrate temperature is increased from a temperature at which the material gas can be decomposed to the growth temperature at which the single crystal can be grown, by continuously supplying a material gas during the temperature increasing step. According to the conventional technique disclosed in Japanese Laid-Open Publication No. 6-244122, a GaAs layer having good surface flatness can be grown on an Si substrate.

In the conventional technique disclosed in above-mentioned Japanese Laid-Open Publication No. 8-20387, crystals having good quality are obtained by preventing As from being mixed into AlGaInP or dissociated at an interface of GaAs and AlGaInP. In the conventional technique disclosed in above-mentioned Japanese Laid-Open Publication No. 2000-216496, crystals having good quality are obtained by preventing oxygen from being mixed into AlGaInP at an interface of GaAs and AlGaInP.

However, through further research, the present inventors found that a phenomena which is not considered in the above conventional techniques is causing deterioration in crystallinity of AlGaInP.

FIG. 11A is a cross-sectional view showing a structure of important parts of a vapor phase growing apparatus 1100 used in growing a compound semiconductor. FIG. 11B is a plan view showing the same.

The vapor phase growing apparatus 1100 includes a reaction chamber (reaction container or reactor) 501 and a substrate holding member (substrate receptacle) 502 provided in the reaction chamber 501. The substrate holding member 502 holds a GaAs substrate. The material gas is supplied from a gas inlet port 501a provided in the reaction chamber 501 and exhausted from a gas outlet port 501b provided in the reaction chamber 501 and is made to flow from one side to the other side with respect to the GaAs substrate. When the gas is supplied to the reaction chamber 501 to grow crystals, reaction products attach not only to the substrate but also to other portions in the reaction chamber 501, such as the substrate holding member 502, a surface of the reaction chamber 501 opposing the substrate, and the like.

The reaction product attached to the reaction chamber 501 may decompose or dissociate and re-evaporate depending on the conditions. The re-evaporated gas may be mixed into the material gas. The re-evaporated gas generated on the downstream side (the side of the gas outlet port 501b) of the substrate is evacuated directly from the reaction chamber 501. The re-evaporated gas generated on the upstream side (the side of the gas inlet port 501a) of the substrate is mixed into the material gas and reaches a surface of the substrate.

The influence of the re-evaporated gas is most strong when the re-evaporated gas reaches the substrate surface on which the semiconductor layer is not growing, such as before the growth or during the interruption of the growth of the semiconductor layer. When the semiconductor layer is growing, elements generated by re-evaporation (hereinafter, referred to as re-evaporated elements) are uniformly mixed into the growing layer. Thus, the concentration of the re-evaporated elements is relatively low. When the semiconductor layer is not yet grown or growth is interrupted, the re-evaporated elements attach to the substrate surface or a crystal surface and are accumulated until the next growth step. Thus, the re-evaporated elements are accumulated on the growth interface at a high concentration.

For example, in the case where In is re-evaporated during the temperature-increasing step before the start of the growth and reaches the GaAs substrate, In reacts and is grown with $AsH_3$ which is supplied during the temperature-increasing step and forms InAs on the surface of the GaAs substrate. Since InAs has a large lattice mismatch with GaAs, crystals are not grown normally. Thus, crystal defects are generated. A GaAs buffer layer and a AlGaInP layer are grown on such crystal defects. Thus, crystals having good quality cannot be obtained.

In the case where the growth of, for example, AlGaInP is interrupted due to a change in composition or the like, supply of the III group material component is stopped to stop the growth with $PH_3$ being supplied. When As is supplied from upstream while $PH_3$ is supplied, As attaches to a surface of the AlGaInP, or a part of phosphorous in the AlGaInP is substituted with As. Thus, crystal defects are generated at the growth interface.

The present inventors conducted detailed research and have found that reaction products which may attach to portions other than the substrate in the reaction chamber are generated with any element, but attachment and re-evaporation of the As and In are remarkable compared to other elements and may cause a significant effect on quality of crystals.

The conventional technique disclosed in Japanese Laid-Open Publication No. 6-244122 is a technique for improving a surface flatness of GaAs on a Si substrate by growing the GaAs layer on the Si substrate with the temperature being increased. It is not directed for preventing impurities from being mixed into a III-V group compound semiconductor layer to improve crystallinity.

SUMMARY OF THE INVENTION

According to one aspect of the present invention, there is provided a method for producing a III-V group compound semiconductor layer, comprising the steps of: forming a first III-V group compound semiconductor layer on a substrate in a reaction chamber; and supplying a III group material gas to the reaction chamber before or after the step of forming the first III-V group compound semiconductor layer to prevent re-evaporation of the III group gas in the reaction chamber.

In one embodiment of the present invention, the step of supplying the III group material gas includes a step of forming a first transition III-V group compound semiconductor layer by supplying the III group material gas.

In another embodiment of the present invention, the step of forming the first III-V group compound semiconductor layer includes a step of forming the first III-V group compound semiconductor layer at a first substrate temperature.

In still another embodiment of the present invention, the step of supplying the III group material gas includes a step of supplying the III group material gas when a substrate temperature becomes a preferable temperature or higher.

In still another embodiment of the present invention, the preferable temperature is a substrate temperature at which crystal defects including crystal defects due to re-evaporation of reaction products produced in the reaction chamber and crystal defects due to insufficiency of migration are minimal.

In still another embodiment of the present invention, the step of supplying the III group material gas includes a step of supplying the III group material gas when the substrate temperature becomes the preferable temperature or higher before the step of forming the first III-V group compound semiconductor layer is finished.

In still another embodiment of the present invention, the step of supplying the III group material gas includes a step of supplying the III group material gas when the substrate temperature becomes the preferable temperature or higher while the substrate temperature increases to a first substrate temperature before the step of forming the first III-V group compound semiconductor layer.

In still another embodiment of the present invention, the step of supplying the III group material gas includes a step of supplying a V group material gas with the III group material gas when the substrate temperature becomes the preferable temperature or higher while the substrate temperature increases to the first substrate temperature.

In still another embodiment of the present invention, a method for producing a III-V group compound semiconductor layer further comprises a step of forming a second III-V group compound semiconductor layer at a second substrate temperature in the reaction chamber, wherein the step of supplying the III group material gas includes a step of supplying the III group material gas while the substrate temperature changes from the first substrate temperature to the second substrate temperature.

In still another embodiment of the present invention, the step of supplying the III group material gas includes a step of supplying a V group material gas with the III group material gas while the substrate temperature changes from the first substrate temperature to the second substrate temperature.

In still another embodiment of the present invention, the first III-V group compound semiconductor layer includes at least one of In and As.

In still another embodiment of the present invention, the substrate is a GaAs substrate; the step of forming the first III-V group compound semiconductor layer includes a step of forming a GaAs buffer layer on the GaAs substrate at a first substrate temperature; the step of supplying the III group material gas includes a step of supplying the III group material gas when the substrate temperature becomes the preferable temperature or higher while the substrate temperature increases to the first substrate temperature.

In still another embodiment of the present invention, the step of supplying the III group material gas includes a step of supplying a III group material gas used in the step of forming the GaAs buffer layer as the III group material gas.

In still another embodiment of the present invention, the substrate is a GaAs substrate, the step of forming the first III-V group compound semiconductor layer includes a step of forming a first GaAs buffer layer at the first substrate temperature on the GaAs substrate; the step of forming the second III-V group compound semiconductor layer includes a step of forming a second GaAs buffer layer at the second substrate temperature; and the step of supplying the III group material gas includes a step of supplying the III group material gas while the substrate temperature changes from the first substrate temperature to the second substrate temperature.

In still another embodiment of the present invention, the step of supplying the III group material gas includes a step of supplying a III group material gas used in at least one of the steps of forming the first GaAs buffer layer and the step of forming the second GaAs buffer layer as the III group material gas.

In still another embodiment of the present invention, a method for producing a III-V group compound semiconductor layer further comprises a step of forming a third III-V group compound semiconductor layer at a substrate temperature higher than at least one of the first substrate temperature and the second substrate temperature in the reaction chamber.

In still another embodiment of the present invention, the step of forming the second III-V group compound semiconductor layer includes a step of forming a second III-V group compound semiconductor layer using the III group material gas after stopping the III group material gas for 10 seconds or shorter.

In still another embodiment of the present invention, a method for producing a III-V group compound semiconductor layer further comprises a step of forming an $(Al_xGa_{1-x})_yIn_{1-y}P$ layer ($0 \leq x < 1$, $0 \leq y < 1$) on the GaAs buffer layer.

In still another embodiment of the present invention, the step of forming the GaAs buffer layer includes a step of forming the GaAs buffer layer at the first substrate temperature using a first V group material gas; and the step of forming the $(Al_xGa_{1-x})_yIn_{1-y}P$ layer ($0 \leq x \leq 1$, $0 \leq y < 1$) includes a step of forming a $(Al_xGa_{1-x})_yIn_{1-y}P$ layer ($0 \leq x \leq 1$, $0 \leq y < 1$) at a second substrate temperature using a second V group material gas, further comprising a step of switching the first V group material gas to the second V group material gas at a substrate temperature lower than the second substrate temperature.

In still another embodiment of the present invention, the step of forming the first III-V group compound semiconductor layer includes a step of forming the first III-V group compound semiconductor layer using a metal organic chemical vapor deposition.

In still another embodiment of the present invention, the preferable temperature is 600° C.

In still another embodiment of the present invention, the preferable temperature is 630° C.

According to another aspect of this invention, there is provided a method for producing a semiconductor light-emitting element comprising: a step of producing a III-V group compound semiconductor layer; and a step of forming a semiconductor light-emitting element using the III-V group compound semiconductor layer, wherein: the step of producing the III-V group compound semiconductor layer includes the steps of: forming a III-V group compound semiconductor layer on a substrate in a reaction chamber; and supplying a III group material gas to the reaction chamber before or after the step of forming the III-V group compound semiconductor layer to prevent re-evaporation of the III group gas in the reaction chamber.

In still another embodiment of the present invention, the step of forming the semiconductor light-emitting element includes a step of forming a semiconductor light-emitting diode or a semiconductor laser.

According to still another aspect of this invention, there is provided a vapor phase growing apparatus, comprising a reaction chamber and a material gas supplying section for supplying a gas to the reaction chamber to form a III-V group compound semiconductor layer on a substrate provided in the reaction chamber, wherein the material gas supplying section supplies a III group material gas to the reaction chamber before or after the formation of the III-V group compound semiconductor layer to prevent re-evaporation of the III group gas in the reaction chamber.

In still another embodiment of the present invention, a vapor phase growing apparatus further comprises a substrate heating section for heating the substrate.

Thus, the invention described herein makes possible the advantages of providing a method for producing a III-V group compound semiconductor layer, a method for producing a semiconductor light-emitting element, and a vapor phase growing apparatus which are able to suppress deterioration of crystallinity of the III-V group compound semiconductor layer due to re-evaporation of reaction products attached to portions other than the substrate in the reaction chamber.

Hereinafter, the effects caused by the above-described arrangement are described.

According to the present invention, re-evaporation of a III group material gas can be prevented by supplying the III group material gas. Thus, it is possible to obtain a III-V group compound semiconductor layer having good quality.

In the present invention, for crystal growth of a III-V compound semiconductor layer at a predetermined substrate temperature, a III group material gas is supplied to a reaction chamber until the growth finishes, when a substrate temperature becomes a preferable temperature or higher. The preferable temperature is a temperature at which the crystal defects due to re-evaporation of In or As from portions around the substrate increases and crystal defects due to insufficiency of migration are reduced (for example, 630° C.). However, an effect of suppressing crystal defects can be obtained at 600° C.

Generally, a V group material gas is supplied to the reaction chamber during a temperature increasing step before the start of crystal growth and/or a growth interruption step for switching compositions in order to prevent As leakage or P leakage. In the present invention, the III group gas is also provided to the reaction chamber to continue crystal growth. Thus, re-evaporated elements do not accumulate on a substrate surface or a growth interface, and defects of a high density are not formed. Accordingly, it is possible to obtain crystals having good quality. The present invention can be applied to, for example, metal organic chemical vapor deposition, to obtain crystals having good quality.

In particular, As and In attach to portions other than the substrate and re-evaporate significantly compared to other elements and cause a large influence on the quality of crystals. Thus, the present invention preferably applied to a III-V compound semiconductor layer including In and/or As as constituent elements. For example, III-V group compound semiconductor including In may be a layer including $((Al_xGa_{1-x})_yIn_{1-y}P$ $(0 \leq x \leq 1, 0 \leq y < 1))$. A semiconductor layer including As may be GaAs buffer layer.

Further, in the present invention, during the temperature increasing step to the predetermined substrate temperature, supply of a III group material gas is started to a reaction chamber, when a substrate temperature becomes 630° C. or higher, at which the crystal defects due to re-evaporation of In or As from portions around the substrate starts to increase and crystal defects due to insufficiency of migration reduces. The growth is started at low substrate temperature, at which an amount of re-evaporation of In and As is small. Thus, In and As do not accumulate on a surface of the substrate at an initial stage of the crystal growth and defects of high density are not formed. Accordingly, it is possible to obtain crystals having good quality.

Still further, in the present invention, for crystal growth of at least two semiconductor layers on a semiconductor substrate at different predetermined substrate temperatures, a III group material gas is supplied to the reaction chamber during a temperature increasing step or a temperature decreasing step between different growth layers. Since the growth is not interrupted between the growth of different growth layers, In and As do not accumulate on a growth interface and defects of high density are not formed. Accordingly, it is possible to obtain crystals having good quality.

Still further, in the present invention, for crystal growth of at least one GaAs buffer layer on a GaAs substrate, in a temperature increasing step to the growth temperature for a GaAs buffer layer to be grown first, supply of a III group material gas to a reaction chamber is started when substrate temperature becomes a preferable temperature (for example, 630° C.) or higher. The growth is started at low substrate temperature, at which an amount of re-evaporation of In and As is small. Thus, In and As do not accumulate on a surface of the GaAs substrate at an initial stage of the crystal growth and defects of high density are not formed. Accordingly, it is possible to obtain crystals having good quality.

As the III group material gas supplied to the reaction chamber in a temperature increasing step to the growth temperature for the GaAs buffer layer to be grown first, it is preferable to use the III group material gas used for the growth of the GaAs buffer layer. If different material gases are used, when switching the gases, it is necessary to provide a time period for interrupting the growth to wait for the gas which has been previously used to be evacuated before starting the supply of the next material gas in order to prevent the material gases from being mixed. If the same material gas is used, it is possible to continue growth during the temperature increasing step with the III group material being supplied. Since the growth is not interrupted, it is possible to grow crystals having good quality.

Still further, in the present invention, for growing two GaAs buffer layers having different growth temperatures on a GaAs substrate, a III group material gas is supplied to the reaction chamber during a temperature increasing step or a temperature decreasing step between growth of different growth layers. Since the growth is not interrupted between the growth of two GaAs buffer layers, In and As do not accumulate on an interface between two layers and defects of high density are not formed. Accordingly, it is possible to obtain crystals having good quality.

As the III group material gas supplied to the reaction chamber in a temperature increasing step or a temperature decreasing step, it is preferable to use the III group material gas used for the crystal growth of at least one of the GaAs buffer layers. If different material gases are used, when switching the gases, it is necessary to provide a time period for interrupting the growth to wait for the gas which has been previously used to be evacuated before starting the supply of the next material gas in order to prevent the material gases from being mixed. On the other hand, if the same material gas is used, it is possible to continue growth during the temperature increasing step or the temperature decreasing step with the III group material being supplied. Since the growth is not interrupted, it is possible to grow crystals having good quality.

The growth temperature for at least one of the GaAs buffer layers may be set to be higher than the growth temperature for the III-V group compound semiconductor to be grown on the GaAs buffer layers. Thus, as in the conventional technique disclosed in Japanese Laid-Open Publication No. 2000-216496, oxygens attached to a substrate holding member and the like at a growth of a GaAs buffer layer are evaporated. Thus, nonluminous recombination centers can be prevented from forming in a III-V compound semiconductor layer to be grown thereon.

As described above, if the growth temperature of at least one of the GaAs buffer layers is set to be higher than the temperature for growing the III-V group compound semiconductor layer formed thereon, In and As deposited on portions around the substrate are re-evaporated more easily-before and after the growth of the GaAs buffer layer. Even in such a case, an amount of accumulation of In and As on a substrate surface and/or a growth interface can be made smaller by supplying a III group material gas into the reaction chamber. Accordingly, it is possible to obtain crystals having good quality.

When switching the material gasses, supply of all the III group material gas may be stopped to temporarily stop the growth in order to prevent the III group material gases being mixed in the reaction chamber. In the case when a process of temporarily stopping the III group material gas is included, accumulation of In and As at an interface surface during growth interruption can be suppressed to a minimum by setting the time period of interruption short, such as 10 seconds or shorter. Accordingly, it is possible to obtain crystals having good quality.

In the crystal growth for producing an electronic device, such as a semiconductor laser, HEMT, HBT or the like, relatively thin films, which have thickness of about 2–3 μm or thinner, are grown. In such a case, an amount of reaction products attached around a substrate holding member are small. Thus, an influence of re-evaporated elements on the crystallinity is relatively small. On the other hand, in the crystal growth for producing a semiconductor light-emitting diode, thick film having a thickness of 3 μm or thicker are mostly formed. Thus, an amount of reaction products attached around a substrate holding member is large and an influence of the re-evaporated elements on the crystallinity is significant. Accordingly, it is particularly effective to use a III-V group compound semiconductor formed by a method for producing a III-V group compound semiconductor layer of the present invention for producing a semiconductor light-emitting diode.

These and other advantages of the present invention will become apparent to those skilled in the art upon reading and understanding the following detailed description with reference to the accompanying figures.

DESCRIPTION OF THE PREFERRED EMBODIMENTS

Examples 1 through 5 of a method for producing a semiconductor light-emitting element using a method for producing a III-V group compound semiconductor layer according to the present invention will be described in detail below. First, the principle of the present invention is described.

Figure 1A:
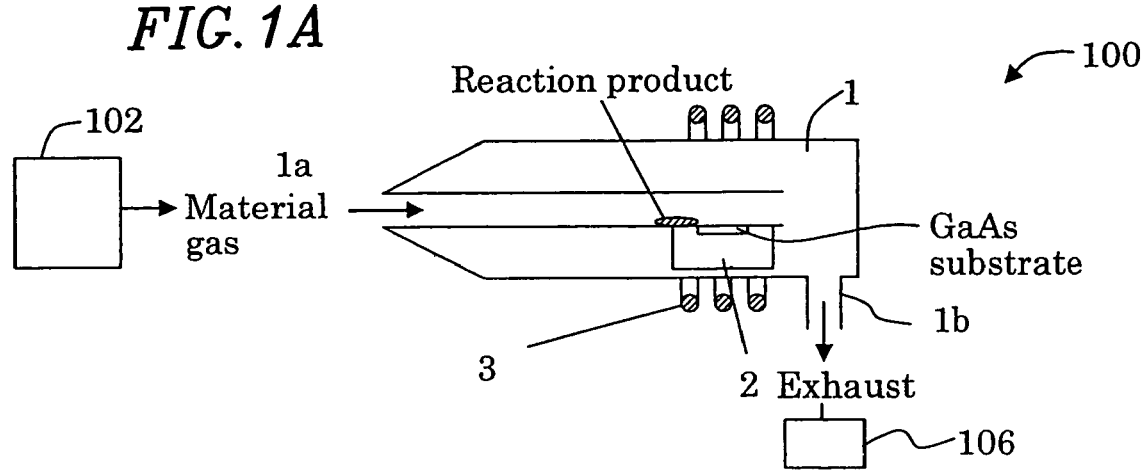
FIG. 1A is a cross-sectional view showing a structure of important parts of a vapor phase growing apparatus used in the Examples of the present invention.
Figure 1B:
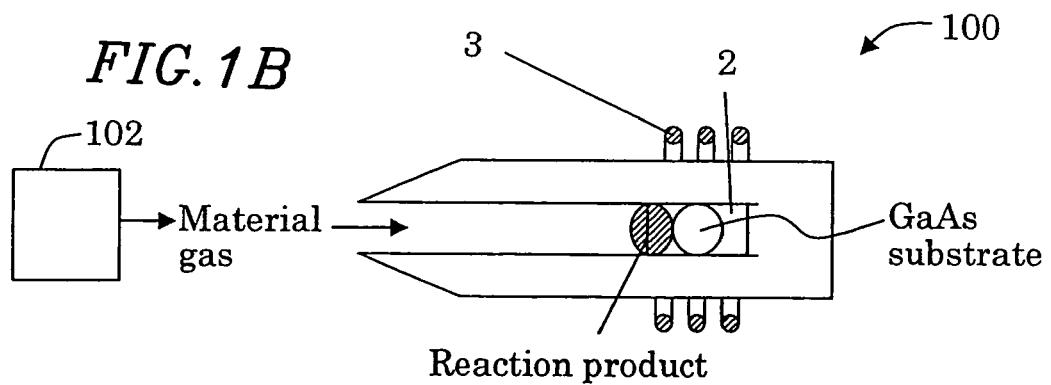
FIG. 1B is a plan view showing the vapor phase growing apparatus of FIG. 1A.

FIG. 1A is a cross-sectional view showing a structure of important parts of a vapor phase growing apparatus 100 used in growing a compound semiconductor layer used in Examples 1 through 5 of the present invention. FIG. 1B is a plan view showing the same.

The vapor phase growing apparatus 100 includes a reaction chamber 1, a material gas supplying section 102 for supplying a material gas to the reaction chamber 1 and an exhaust section 106 for exhausting gas in the reaction chamber 1.

Referring to FIGS. 1A and 1B, the vapor phase growing apparatus 100 used in the Examples of the present invention includes the reaction chamber (reactor) 1 and a substrate holding member (substrate receptacle) 2 made of carbon and provided in the reaction chamber 1. The substrate holding member 2 holds a GaAs substrate. A gas inlet port 1a and a gas outlet port 1b are provided in the reaction chamber 1. The material gas supplied from the material gas supplying section 102 is supplied from the gas inlet port 1a and exhausted from the gas outlet port 1b by the exhaust section 106. Thus, a desirable atmosphere in the reaction chamber 1 can be obtained.

Radio-frequency coils (RF coils) 3 which serve as substrate heating means are provided below the substrate holding member 2. Radio-frequency current flowing through the RF coils 3 causes induction heating of the substrate holding member 2. Thus, the substrate temperature of the GaAs substrate is increased. Furthermore, a radiation thermometer (not shown) is provided below the substrate holding member 2 for allowing the temperature (substrate temperature) of the substrate holding member 2 to be measured, thus the temperature is controlled.

The III-V group compound semiconductor layer can be grown by a metal organic chemical vapor deposition. As III group materials, trimethyl aluminum (TMA), trimethyl gallium (TMG), and trimethyl indium (TMI) are used. As V group materials, arsine ($AsH_3$) and phosphine ($PH_3$) are used. Further, as doping materials, diethyl zinc (DEZn), cyclopentadienyl magnesium ($Cp_2Mg$), hydrogen selenide ($H_2Se$), silane ($SiH_4$) and the like may be used. The temperature of the substrate surface is measured using a radiation thermometer calibrated with the melting point of aluminum.

A desirable semiconductor light-emitting element, such as, a semiconductor light-emitting diode, a semiconductor laser and the like may be produced by growing a III-V group compound semiconductor layer which forms a semiconductor light-emitting element using the above-described vapor phase growing apparatus 100 and materials, and performing a variety of processing such as etching, photolithography, metal vapor deposition, cutting and the like, as respectively required.

In the above-described vapor phase growing apparatus 100, when crystals are grown with the material gas supplied to the reaction chamber 1, reaction products attach not only to the substrate but also to other portions in the reaction chamber 1, such as portions around the substrate holding member 2, a surface of the reaction chamber 1 opposing the substrate, and the like. When the reaction products are heated in a crystal growth process afterward, the reaction products are re-evaporated and may adversely influence the quality of the crystals of the growing layer. The objective of the present invention is to suppress the bad influence of the re-evaporation of the reaction products on the quality of the crystal to a minimum.

The present inventors have found the relationship between crystal defects due to re-evaporation of reaction products and the growth temperature from experiments as follows.

Figure 2A:
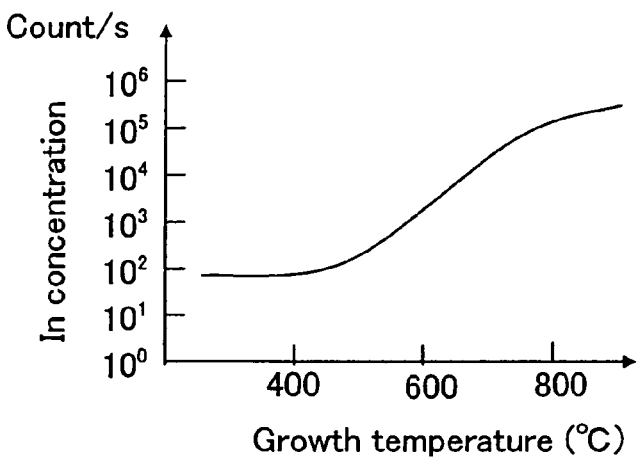
FIG. 2A is a graph showing the relationship between growth temperature (substrate temperature) and an amount of re-evaporated elements for growth of a III-V group compound semiconductor layer.

An amount of elemental (In) impurities incorporated into crystals (In concentration) was measured by SIMS (Secondary Ion Mass Spectrometry). The relationship between growth temperature (substrate temperature) and an amount of re-evaporated elements was obtained. The result is shown in a graph of FIG. 2A. As can be seen from FIG. 2A, the amount of re-evaporated elements (In concentration) increases in a region where the growth temperature is about 400° C. or higher and the amount of re-evaporated elements starts to increase as the growth temperature increases. Regarding the amount of re-evaporated elements (As concentration) (not shown), re-evaporation starts to increase around the growth temperature for 300° C.

Figure 2B:
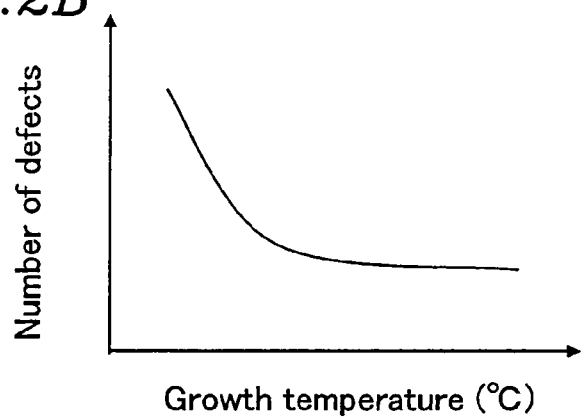
FIG. 2B is a graph schematically showing the relationship between the growth temperature and the number of the crystal defects.

Meanwhile, 400° C. is too low as the growth temperature and may cause crystal defects due to insufficient migration. FIG. 2B is a graph schematically showing a relationship between the growth temperature and the number of the crystal defects. As can be seen from FIG. 2B, crystal defects due to insufficiency in migration decrease as the substrate temperature increases.

Therefore, crystallinity of the III-V group compound semiconductor layer is determined depending upon tradeoff between the amount of re-evaporation and migration. Specifically, if the crystal growth is started at a too low temperature, crystal defects increase because of insufficiency in migration. If the growth temperature is too high, the amount of re-evaporation of reaction products before the crystal growth and during the interruptions between the growth increases, thereby increasing crystal defects.

Figure 2C:
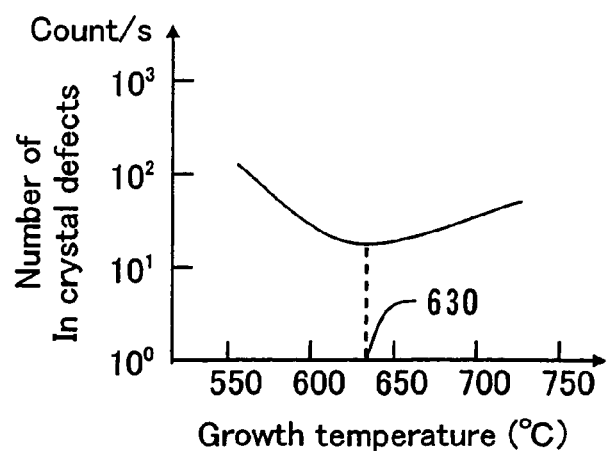
FIG. 2C is a graph showing the relationship between the growth temperature and the number of In crystal defects obtained through experiments.

FIG. 2C is a graph showing the relationship between the growth temperature and the number of In crystal defects obtained through experiments. The number of defects observed on a surface of the semiconductor layer is least when the temperature to start the growth is 630° C.

Once the crystal growth is started, reaction products present around the substrate holding member gradually decrease by re-evaporation as crystals continue to grow. Thus, the above preferable temperature 630° C. is different from the so-called preferable growth temperature.

Accordingly, in the present Example, for crystal growth of the III-V group compound semiconductor layer at a predetermined substrate temperature, the crystal growth of the III-V group compound semiconductor is performed with the III group material gas being supplied to the reaction chamber when the substrate temperature becomes a preferable temperature or higher. The preferable temperature is a temperature at which the re-evaporation of In or As from portions around the substrate starts to increase and insufficiency of migration reduces, until the crystal growth is finished (for example, 630° C.). However, an effect of suppressing crystal defects can be obtained at 600° C.

For example, when the substrate temperature reaches a preferable temperature (for example, 630° C.) or higher in a temperature increasing step to a predetermined substrate temperature, supply of the III material gas into the reaction chamber is started and crystal growth of the III-V group compound semiconductor layer is performed. Further, in the temperature increasing process or a temperature decreasing process between the growing layers, III group material gas is supplied to the reaction chamber to continue the growth of the III-V group compound semiconductor layer. When the supply of the III group material gas is temporally stopped, the time period of being stopped is set to be 10 seconds or shorter.

Compared to the temperature increasing step before the crystal growth and crystal growth interruptions, the concentration is lower since re-evaporated elements deposited on a crystal growth interface are incorporated into the layer grown with crystal growth. Thus, the crystal defects in the layer grown with crystal growth are reduced to obtain a crystal structure having good quality.

Regarding As concentration, re-evaporation starts around a substrate temperature of about 300° C. A substrate temperature of 540° C. is a preferable temperature. Therefore, the III group material gas may be supplied to the reaction chamber to perform crystal growth of the III-V group compound semiconductor when the substrate temperature is preferable temperature (for example, 540° C.) or higher (an effect of suppressing crystal defects can be obtained at 500° C.).

Figure 3A:
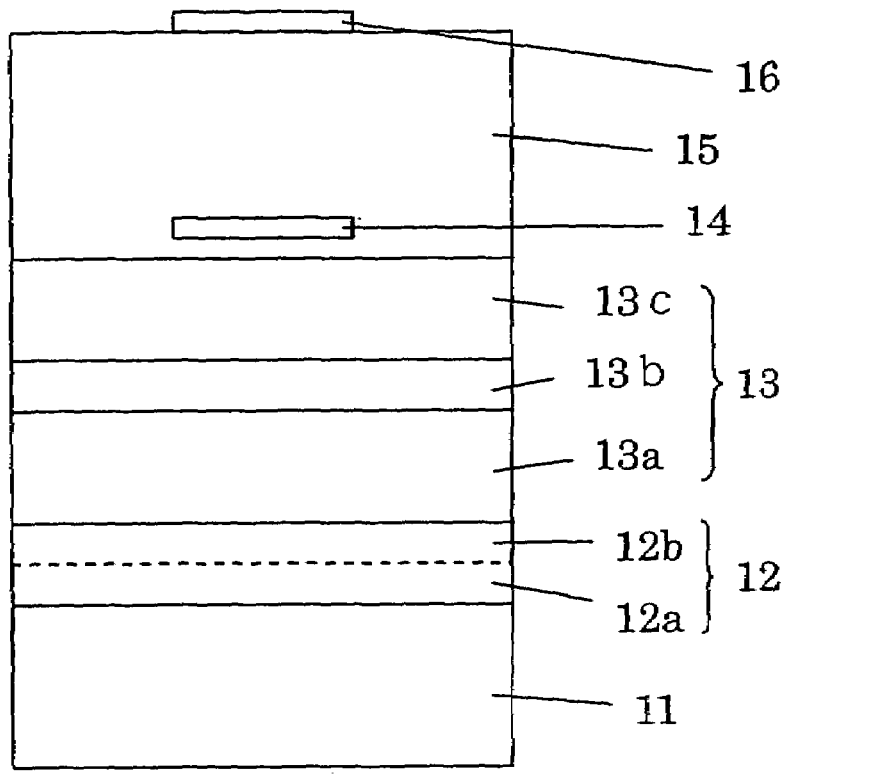
FIG. 3A is a cross-sectional view showing an exemplary structure of a semiconductor light-emitting diode produced in the Examples of the present invention.

FIG. 3A is a cross-sectional view showing an exemplary structure of a lamination of a semiconductor light-emitting diode 300 produced by a method for producing a III-V group compound semiconductor layer according to the present invention.

Referring to FIG. 3A, the semiconductor light emitting diode 300 includes a GaAs substrate 11, a GaAs buffer layer 12, a light-emitting portion 13, and a current diffusion layer 15. The GaAs buffer layer 12, the light-emitting portion 13, and the current diffusion layer 15 are laminated on the GaAs substrate 11 in this order. An electrode 16 is located centrally with respect to a width direction on the current diffusion layer 15.

The GaAs buffer layer 12 includes a first GaAs buffer layer 12a and a second GaAs buffer layer 12b laminated in this order from the substrate side. The crystal growth of the first GaAs buffer layer 12a is performed at a substrate temperature higher than AlGaInP layer $((Al_xGa_{1-x})_yIn_{1-y}P$ $(0 \leq x \leq 1, 0 \leq y < 1))$ forming the light-emitting portion 13.

Alternately, the buffer layer may have a structure of a single layer.

The light-emitting portion 13 includes a AlGaInP lower clad layer 13a, an active layer 13b and a AlGaInP upper clad layer 13c. The AlGaInP upper clad layer 13c and the AlGaInP lower clad layer 13*a* are respectively laminated to upper and lower surfaces of the active layer 13*b*.

A current blocking layer 14 is provided in the current diffusion layer 15 located centrally with respect to the width direction so as to oppose the electrode 16 via a portion of the current diffusion layer 15 with a predetermined gap from the light-emitting portion 13 in a thickness direction. A current supplied from the electrode 16 flows through the current diffusion layer 15 more easily than through the current blocking layer 14. Thus, the current is spread in the current diffusion layer 15 and supplied to the light-emitting portion 13.

Figure 3B:
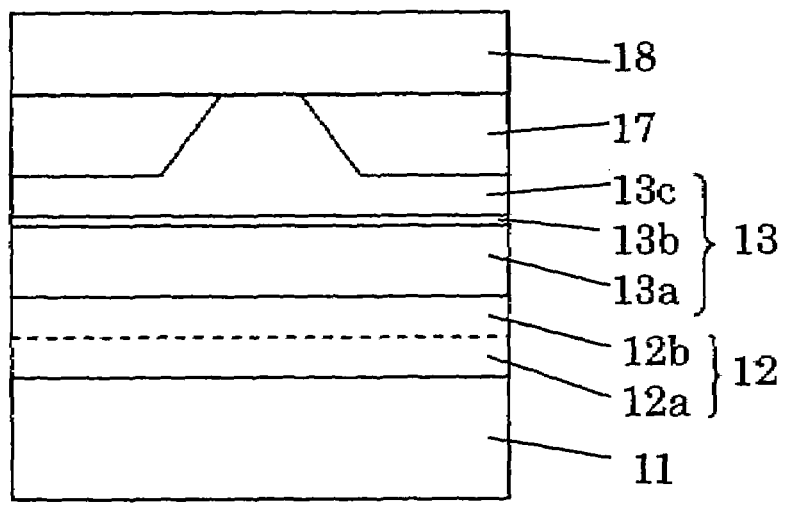
FIG. 3B is a cross-sectional view showing an exemplary structure of a semiconductor laser produced in the Examples of the present invention.

FIG. 3B is a cross-sectional view showing an exemplary structure of a lamination of a semiconductor laser 350 produced by a method for producing a III-V group compound semiconductor layer according to the present invention.

In FIG. 3B, the semiconductor laser 350 includes a GaAs substrate 11, a GaAs buffer layer 12, a light-emitting portion 13 and a GaAs contact layer 18. The GaAs buffer layer 12, the light-emitting portion 13 and the GaAs contact layer 18 are laminated on the GaAs substrate 11 in this order.

The GaAs buffer layer 12 includes a first GaAs buffer layer 12*a* and a second GaAs buffer layer 12*b* laminated in this order from the substrate side. The crystal growth of the first GaAs buffer layer 12*a* is performed at a substrate temperature higher than AlGaInP layer $((Al_xGa_{1-x})_yIn_{1-y}P$ $(0 \leq x \leq 1, 0 \leq y < 1))$ forming the light-emitting portion 13.

Alternately, the buffer layer may have a structure of a single layer.

The light-emitting portion 13 includes a AlGaInP lower clad layer 13*a*, a AlGaInP active layer 13*b* and a AlGaInP upper clad layer 13*a*. The AlGaInP upper clad layer 13*c* and the lower AlGaInP lower clad layer 13*a* are respectively laminated to upper and lower surfaces of the AlGaInP active layer 13*b*.

End portions of the upper clad layer 13*c* are removed with a predetermined thickness with respect to the active layer 13*b* such that the upper clad layer 13*c* has a trapezoidal-shaped cross-section at the center portion of the upper clad layer 13*c*. GaAs current block layer 17 is provided to fill in the trapezoidal-shaped portions.

The GaAs contact layer 18 is provided across upper surfaces of the trapezoidal-shaped portions of the AlGaInP upper clad layer 13*c* and upper surface of the GaAs current block layer 17. A current provided from the GaAs contact layer 18 flows through the AlGaInP upper clad layer 13*c* more easily than through the GaAs current block layer 17. Thus, the current is collected to the center through the trapezoidal portion provided in the center of the AlGaInP upper clad layer 13*c* and is supplied to the AlGaInP active layer 13*b*.

As described above, according to the present invention, a semiconductor light-emitting diode and a semiconductor laser having the layer structures as shown in FIGS. 3A and 3B can be produced. However, the present invention can be applied to production of any semiconductor light-emitting element including those having such layer structures.

Hereinafter, Examples 1 through 5 of specific structures of the present invention are described.

EXAMPLE 1

In Example 1, a GaAs buffer layer 12 is grown on a GaAs substrate 11 before a AlGaInP layer which forms a light-emitting portion 13 of a semiconductor light-emitting element is laminated, at a substrate temperature of 650° C., which is lower than the growth temperature for the AlGaInP layer, which forms the light-emitting portion 13, of 730° C.

Figure 4:
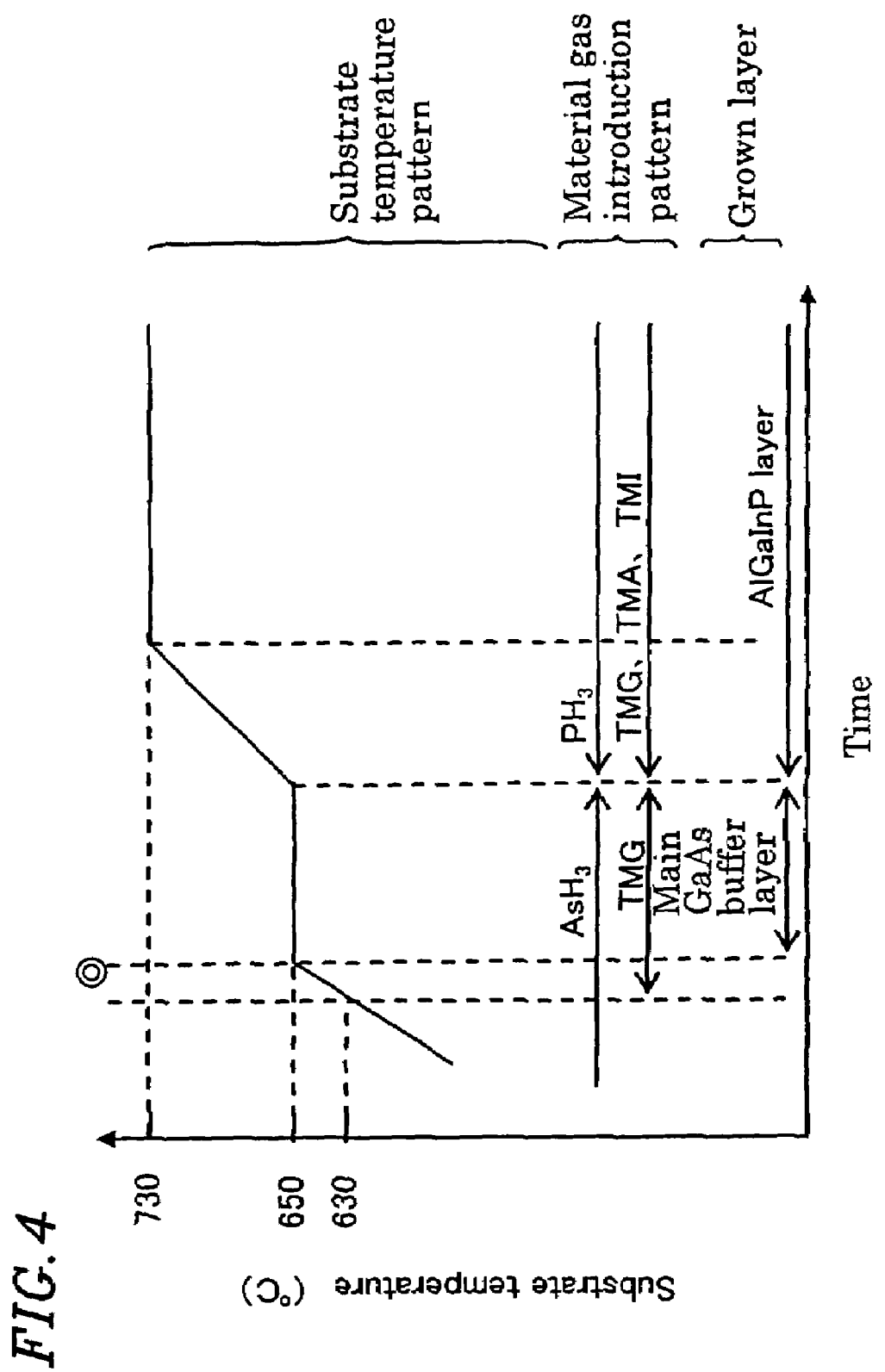
FIG. 4 is a diagram showing a pattern in substrate temperature and material gas introduction during the growth over time in a method for producing a III-IV group compound semiconductor layer of Example 1.

FIG. 4 is a diagram showing a pattern in substrate temperature and material gas introduction during the growth over time in a method for producing a III-IV group compound semiconductor layer of Example 1.

With reference to FIG. 4, first, a GaAs substrate 11 is placed on a substrate holding member 2 in a reaction chamber 1. The atmosphere in the reaction chamber 1 is reduced to desirable pressure. Then, as a V group material gas, $AsH_3$ is introduced into the reaction chamber 1. Next, during a step of increasing substrate temperature of the GaAs substrate 11 to the growth temperature for the GaAs buffer layer 12 of 650° C., at the point when the substrate temperature reaches a preferable temperature (for example, 630° C.), TMG is introduced into the reaction chamber 1 as a III group material gas to grow the transition GaAs buffer layer. As crystal growth of the GaAs buffer layer 12 continues, the substrate temperature of the GaAs substrate 11 is increased to 650° C. With the substrate temperature maintained at 650° C. to form a GaAs buffer layer, the main GaAs buffer layer 12 is grown until it has a predetermined thickness. The GaAs buffer layer 12 includes the transition GaAs buffer layer and the main GaAs buffer layer.

Next, at the growth temperature for the GaAs buffer layer 12, of 650° C., which is lower than the growth temperature for the AlGaInP layer, the V group material gas $AsH_3$ and the III group material gas TMG for the GaAs buffer layer 12 are switched to a V group material gas $PH_3$ and III group material gases TMG, TMA and TMI for the AlGaInP layer which forms the light-emitting portion 13. As the AlGaInP layer continuously grows without an interruption, the temperature is increased to the preferable growth temperature for the AlGaInP layer, 730° C. With the substrate temperature of the GaAs substrate 11 maintained at 730° C., the AlGaInP layer, which forms a light-emitting portion 13, is grown until it has a predetermined thickness.

In Example 1, as indicated by ⊙ in FIG. 4, at a point when the substrate temperature becomes a preferable temperature (for example, 630° C.) or higher during the temperature increasing step before the main GaAs buffer layer is formed, supply of the III group material gas, TMG, is started to perform the crystal growth of the GaAs buffer layer 12. The crystal growth of the GaAs buffer layer 12 is continuously performed until the temperature reaches the growth temperature for the GaAs buffer layer 12, 650° C.

If a semiconductor layer is not grown in the temperature increasing step before the growth of the main GaAs buffer layer, elements attached around the substrate holding member 2 are re-evaporated due to an increase in the substrate temperature. The re-evaporated elements attach to a surface of the GaAs substrate 11. These may be nuclei of crystal defects and may significantly deteriorate quality of crystals, including the light-emitting portion 13 which is to be grown later.

In Example 1, the re-evaporated elements are generated while a semiconductor layer is grown with the III group material gas being supplied in the temperature increasing step. However, the re-evaporated elements are incorporated into crystals during the growth process and do not concentrate and accumulate on one interface. Therefore, the concentration of the re-evaporated elements is low, and thus, their influence on the crystallinity is small.

Using the III-V group compound semiconductor layer formed in Example 1, a semiconductor light-emitting diode was produced and the performance thereof was evaluated. The result shows that the luminance has improved by about 10% compared to the one produced without the supply of the III group material gas and thus without the crystal growth during the temperature increasing step. The semiconductor laser as shown in FIG. 3B produced using this semiconductor layer also has improved crystallinity and performance.

EXAMPLE 2

In Example 2, unlike in Example 1, a first GaAs buffer layer 12a is grown on a GaAs substrate 11 at 780° C., which is higher than the growth temperature for a AlGaInP layer, which forms a light-emitting portion 13, at 730° C., before a second GaAs buffer layer 12b is grown at 630° C., which is lower than the growth temperature for the AlGaInP layer, at 730° C. In Example 2, crystal growth of the GaAs buffer layer 12 is continued with a III group material gas being supplied during a temperature decreasing step before the second main GaAs buffer layer is formed. Though re-evaporated elements are generated, they are incorporated into crystals during the growth process and do not concentrate and accumulate on one interface. Thus, deterioration in the crystallinity can be suppressed.

Figure 5:
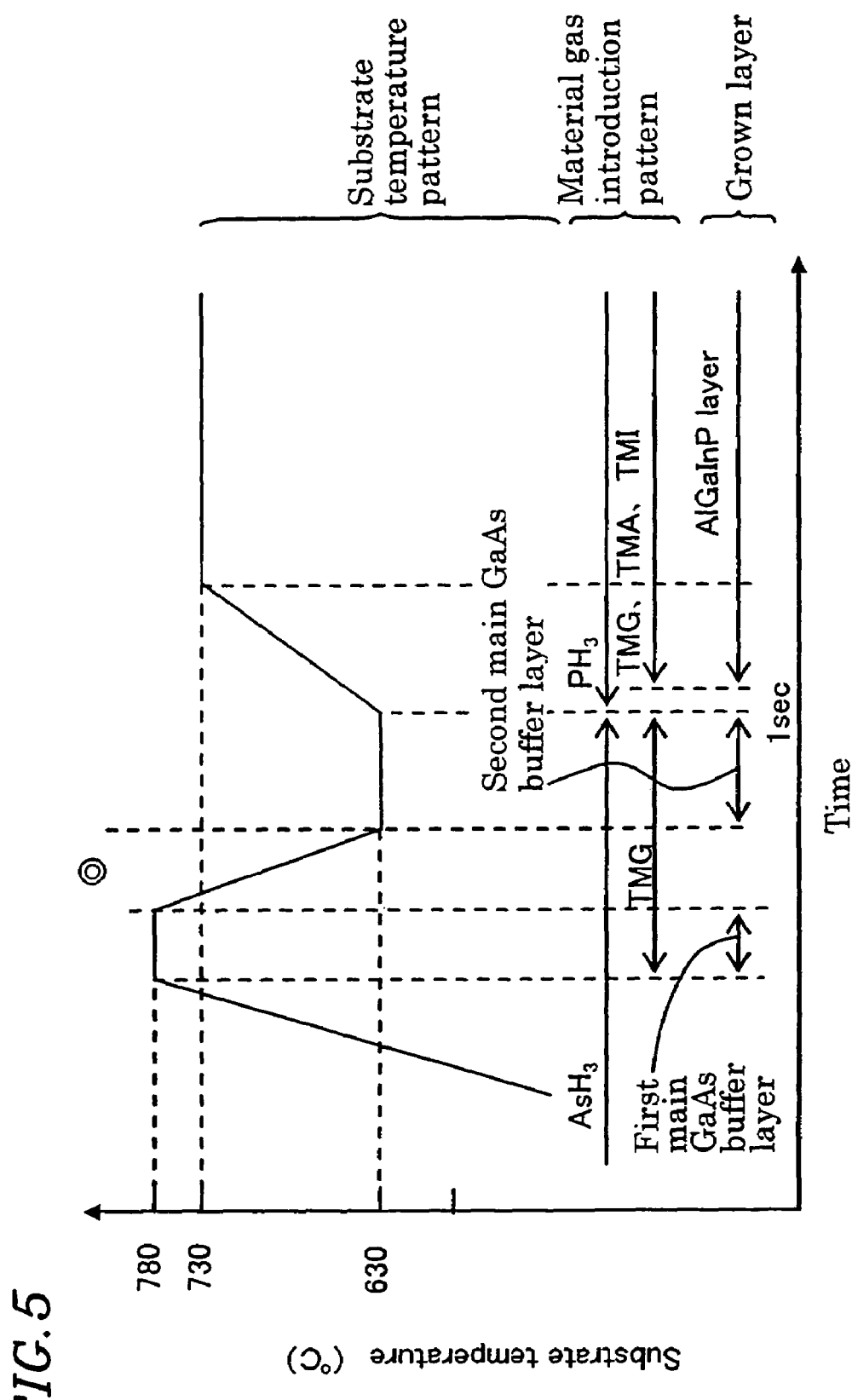
FIG. 5 is a diagram showing a pattern in substrate temperature and material gas introduction during the growth over time in a method for producing a III-IV group compound semiconductor layer of Example 2.

FIG. 5 is a diagram showing a pattern in substrate temperature and material gas introduction during the growth over time in a method for producing a III-IV group compound semiconductor layer of Example 2.

With reference to FIG. 5, first, a GaAs substrate 11 is placed on a substrate holding member 2 in a reaction chamber 1. The atmosphere in the reaction chamber 1 is reduced to desirable pressure. Then, as a V group material gas, $AsH_3$ is introduced into the reaction chamber 1. Next, substrate temperature of the GaAs substrate 11 is increased to the growth temperature for the first GaAs buffer layer 12a, which is 780° C. TMG is introduced to the reaction chamber 1 as a III group material. With the substrate temperature maintained at 780° C., the first GaAs buffer layer 12a is formed as the first main GaAs buffer layer until it has a predetermined thickness.

During a step of decreasing the substrate temperature of the GaAs substrate 11 to the growth temperature of the second GaAs buffer layer 12b, at 630° C., the supply of the TMG to the reaction chamber 1 is not stopped and the GaAs buffer layer continues to grow, and a transition GaAs buffer layer is formed. As the crystal growth continues without an interruption, the substrate temperature of the GaAs substrate 11 is decreased to 630° C. With the substrate temperature maintained at 630° C. to form a second main GaAs buffer layer, the second GaAs buffer layer 12b is grown until it has a predetermined thickness. The second GaAs buffer layer 12b includes the transition GaAs buffer layer and the second main GaAs buffer layer.

Next, at the growth temperature for the second GaAs buffer layer 12b of 630° C., which is lower than the growth temperature for the AlGaInP layer, the V group material gas $AsH_3$ for the GaAs buffer layer 12 is switched to a V group material gas $PH_3$ for the AlGaInP layer which forms the light-emitting portion 13. The supply of the III group material gas TMG for the GaAs buffer layer 12 is stopped. The substrate temperature of the GaAs substrate 11 is increased to the preferable growth temperature for the AlGaInP layer, 730° C. During the temperature increasing step, 1 second after the switching from $AsH_3$ to $PH_3$, supply of III group material gases TMG, TMA and TMI for the AlGaInP layer, which forms the light-emitting portion 13, are started. As the AlGaInP layer is grown, the temperature is increased to the preferable growth temperature for the AlGaInP layer, 730° C. With the substrate temperature of the GaAs substrate 11 maintained at 730° C., the AlGaInP layer, which forms the light-emitting portion 13, is grown until it has a predetermined thickness.

In Example 2, as indicated by ⊙ in FIG. 5, during the temperature decreasing step between the growth of the first main GaAs buffer layer and the second main GaAs buffer layer, supply of the III group material gas, TMG, is not stopped, and the crystal growth of the GaAs buffer layer 12 is continued. The crystal growth of the GaAs buffer layer 12 is continuously performed until the temperature reaches the growth temperature for the second GaAs buffer layer 12b, at 630° C.

If the supply of the III group compound material gas is stopped, and thus the growth is interrupted, in the temperature decreasing step between the growth of the first main GaAs buffer layer and the second main GaAs buffer layer, elements attached around the substrate holding member 2 are re-evaporated during the interruption. The re-evaporated elements attach to a surface of the first GaAs buffer layer 12a. These may be nuclei of crystal defects and may significantly deteriorate quality of crystals, including the light-emitting portion 13 which is to be grown later.

In Example 2, the re-evaporated elements are generated while a semiconductor layer is grown with the III group material gas being supplied in the temperature decreasing step. However, the re-evaporated elements are incorporated into crystals during the growth process and do not concentrate and accumulate on one interface. Therefore, the concentration of the re-evaporated elements is low, and thus, their influence on the crystallinity is small.

Using the III-V group compound semiconductor layer formed in Example 2, a semiconductor light-emitting diode was produced and the performance thereof was evaluated. The result shows that the luminance has improved by about 10% compared to the one formed without the supply of the III group material gas and thus without crystal growth during the temperature decreasing step. The semiconductor laser as shown in FIG. 3B produced using this semiconductor layer also has improved crystallinity and performance.

EXAMPLE 3

In Example 3, as in Example 2, a first GaAs buffer layer 12a is grown on a GaAs substrate 11 at 780° C., which is higher than the growth temperature for a AlGaInP layer which forms a light-emitting portion 13, at 730° C., before a second GaAs buffer layer 12b is grown at 630° C., which is lower than the growth temperature for the AlGaInP layer, at 730° C.

Figure 6:
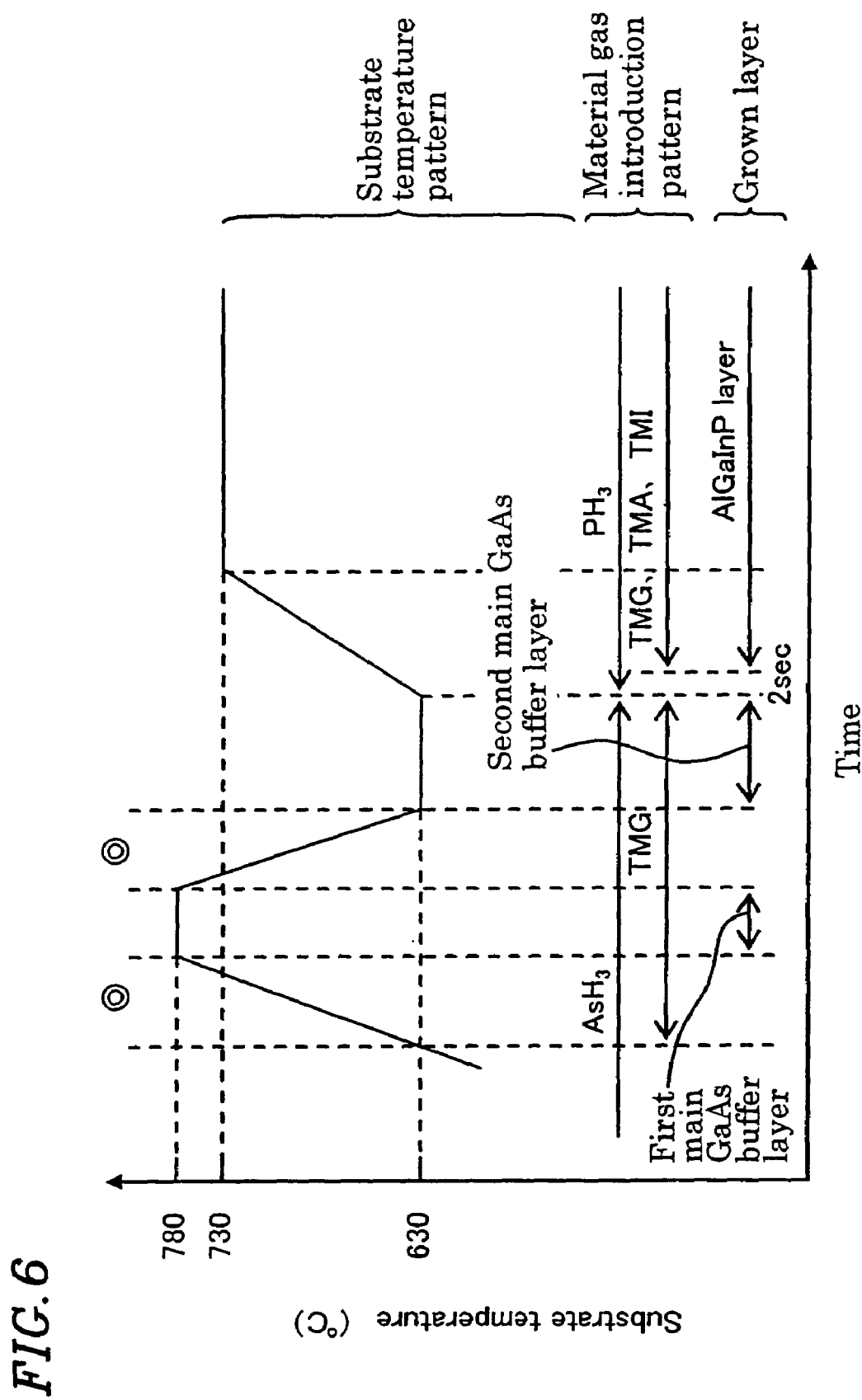
FIG. 6 is a diagram showing a pattern in substrate temperature and material gas introduction during the growth over time in a method for producing a III-IV group compound semiconductor layer of Example 3.

FIG. 6 is a diagram showing a pattern in substrate temperature and material gas introduction during the growth over time in a method for producing a III-IV group compound semiconductor layer of Example 3.

With reference to FIG. 6, first, a GaAs substrate 11 is placed on a substrate holding member 2 in a reaction chamber 1. The atmosphere in the reaction chamber 1 is reduced to a desirable pressure. Then, as a V group material gas, $AsH_3$ is introduced into the reaction chamber 1. Next, during a step of increasing substrate temperature of the GaAs substrate 11 to the growth temperature for the first GaAs buffer layer 12a, at 780° C., at the point when the substrate temperature reaches a preferable temperature (for example, 630° C.), TMG is introduced into there action chamber 1 as a III group material gas to perform crystal growth of the GaAs buffer layer to form a first transition GaAs buffer layer. As the crystal growth of the GaAs buffer layer 12 continues, the substrate temperature of the GaAs substrate 11 is increased to 780° C. With the substrate temperature maintained at 780° C. to form a first main GaAs buffer layer, crystal growth of the first GaAs buffer layer 12a is performed until it has a predetermined thickness. The first GaAs buffer layer 12a includes the first transition GaAs buffer layer and the first main GaAs buffer layer.

During a step of decreasing the substrate temperature of the GaAs substrate 11 to the growth temperature of the second GaAs buffer layer 12b, at 630° C., the supply of the TMG to the reaction chamber 1 is not stopped and the GaAs buffer layer continues to grow and a second transition GaAs buffer layer is formed. As the crystal growth continued without an interruption, the substrate temperature of the GaAs substrate 11 is decreased to 630° C. With the substrate temperature maintained at 630° C. to form a second main GaAs buffer layer, the second GaAs buffer layer 12b is grown until it has a predetermined thickness. The second GaAs buffer layer 12b includes the second transition GaAs buffer layer and the second main GaAs buffer layer.

Next, at the growth temperature for the second GaAs buffer layer 12b of 630° C., which is lower than the growth temperature for the AlGaInP layer, the V group material gas $AsH_3$ for the GaAs buffer layer 12 is switched to a V group material gas $PH_3$ for the AlGaInP layer which forms the light-emitting portion 13. The supply of the III group material gas TMG for the GaAs buffer layer 12 is stopped. The substrate temperature of the GaAs substrate 11 is increased to the preferable growth temperature for the AlGaInP layer, 730° C. During the temperature increasing step, 2 seconds after the switching from $AsH_3$ to $PH_3$, supply of III group material gases TMG, TMA and TMI for the AlGaInP layer, which forms the light-emitting portion 13, are started. As the AlGaInP layer is grown, the temperature is increased to the preferable growth temperature for the AlGaInP layer, which is 730° C. With the substrate temperature of the GaAs substrate 11 maintained at 730° C., the AlGaInP layer, which forms the light-emitting portion 13, is grown until it has a predetermined thickness.

In Example 3, as indicated by the left-hand side ⊚ in FIG. 6, at a point when the substrate temperature becomes a preferable temperature (for example, 630° C.) or higher during the temperature increasing step before the first main GaAs buffer layer is formed, supply of the III group material gas, TMG, is started to perform crystal growth of the first GaAs buffer layer 12a. The first GaAs buffer layer 12a is continuously grown until the temperature reaches the growth temperature, for the first GaAs buffer layer 12a, which is 780° C.

Furthermore, in Example 3, as indicated by the right-hand side ⊚ in FIG. 6, during the temperature decreasing step between the growth of the first main GaAs buffer layer and the second main GaAs buffer layer, supply of the III group material gas, TMG, is not stopped, and the crystal growth of the GaAs buffer layer is continued. The crystal growth of the GaAs buffer layer 12 is continuously performed until the temperature reaches the growth temperature for the second GaAs buffer layer 12b, which is 630° C.

As described with respect to Examples 1 and 2, if a semiconductor layer is not grown, as a result of no supply of the III material gas in the temperature increasing step before the first main GaAs buffer layer is formed and in the temperature decreasing step between the growth of the first main GaAs buffer layer and the second main GaAs buffer layer, elements attached around the substrate holding member 2 are re-evaporated. The re-evaporated elements attach to a surface of the GaAs substrate 11 and the first GaAs buffer layer 12a. These may be nuclei of crystal defects and may significantly deteriorate the quality of crystals, including the light-emitting portion 13 which is to be grown later.

In Example 3, the re-evaporated elements are generated while a semiconductor layer is grown with the III group material gas being supplied in the temperature increasing step and the temperature decreasing step. However, the re-evaporated elements are incorporated into crystals during the growth process and do not concentrate and accumulate on one interface. Therefore, the concentration of the re-evaporated elements is low, and thus, their influence on the crystallinity is small.

Using the III-V group compound semiconductor layer formed in Example 3, a semiconductor light-emitting diode was produced and the performance thereof was evaluated. The result shows that the luminance has improved by about 20% compared to the semiconductor light-emitting diode produced without the supply of the III group material gas and thus without the crystal growth during the temperature decreasing step. The semiconductor laser as shown in FIG. 3B produced using this semiconductor layer also has improved crystallinity and performance.

EXAMPLE 4

In Example 4, unlike Example 1, a DBR layer (optical reflection layer) is provided between a GaAs buffer layer 12 and a AlGaInP layer which forms a light-emitting portion 13 of a semiconductor light-emitting element. The DBR layer reflects a part of the light emitting from the light-emitting portion 13, which heads toward a substrate, and directs this light to a light output surface opposing the substrate in order to improve an efficiency of light to be output. The main DBR layer can be formed by the crystal growth of AlAs layers and AlGaAs layers alternately repeated for 20 times at the same substrate temperature as the growth temperature for the AlGaInP layer, which is 730° C.

Figure 7:
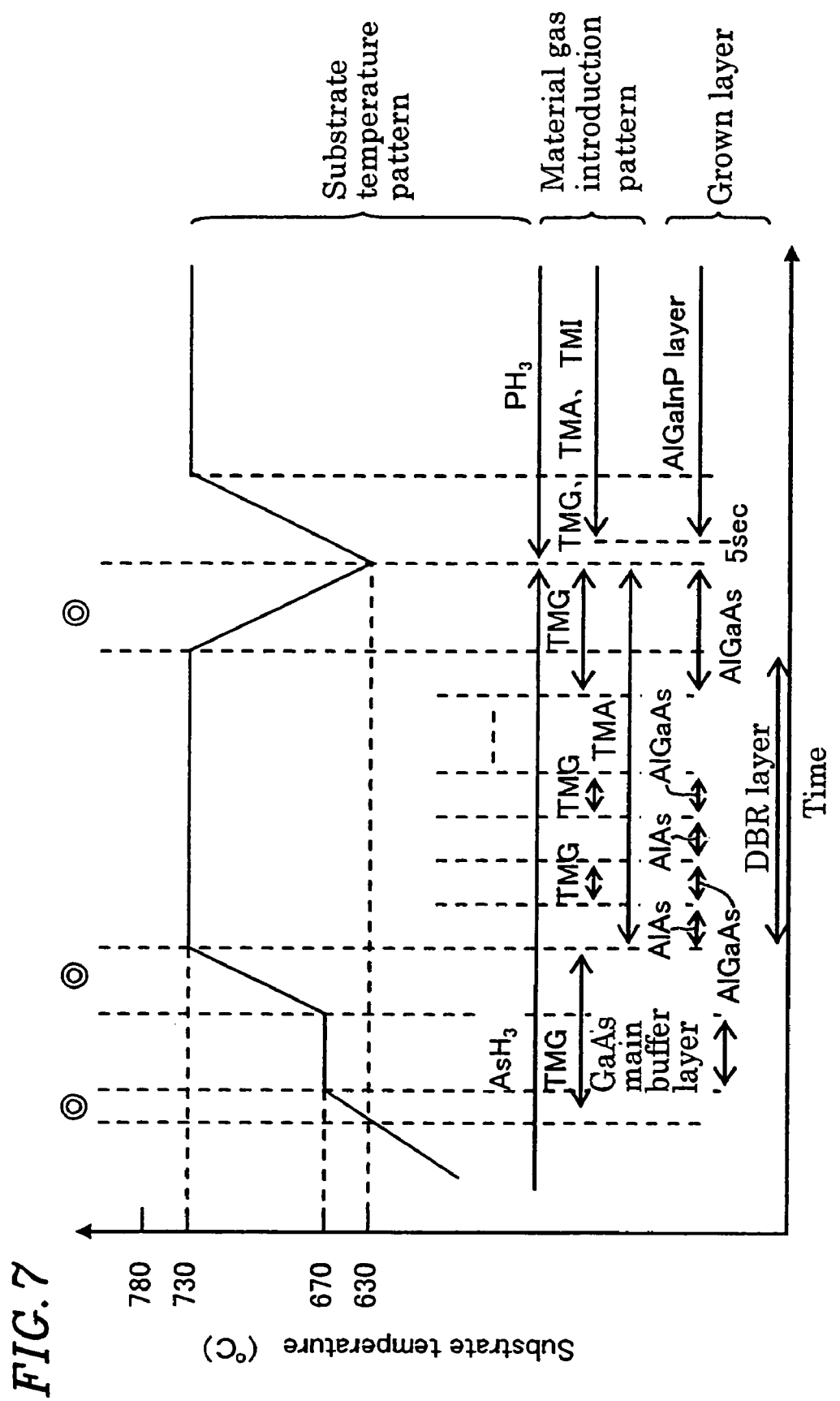
FIG. 7 is a diagram showing a pattern in substrate temperature and material gas introduction during the growth over time in a method for producing a III-IV group compound semiconductor layer of Example 4.

FIG. 7 is a diagram showing a pattern in substrate temperature and material gas introduction during the growth over time in a method for producing a III-IV group compound semiconductor layer of Example 4.

With reference to FIG. 7, first, a GaAs substrate 11 is placed on a substrate holding member 2 in a reaction chamber 1. The atmosphere in the reaction chamber 1 is reduced to a desirable pressure. Then, as a V group material gas, $AsH_3$ is introduced into the reaction chamber 1. Next, during a step of increasing substrate temperature of the GaAs substrate 11 to the growth temperature for the GaAs buffer layer 12, 670° C., at the point when the substrate temperature reaches a preferable temperature (for example, 630° C.), TMG is introduced into the reaction chamber 1 as a III group material gas to form a first transition GaAs buffer layer. As the crystal growth of the GaAs buffer layer 12 continues, the substrate temperature of the GaAs substrate 11 is increased to 670° C. With the substrate temperature maintained at 670° C. to form a main GaAs buffer layer.

In a step of increasing the substrate temperature of the GaAs substrate 11 to the growth temperature for the DBR layer, which is 730° C., crystal growth is continued without stopping the supply of TMG to the reaction chamber 1. The crystal growth of the GaAs buffer layer 12 is performed to form a second transition GaAs buffer layer. The GaAs buffer layer 12 includes the first transition GaAs buffer layer, the main GaAs buffer layer, and the second transition-GaAs buffer layer.

Next, at the growth temperature for the DBR layer, 730° C., as III group material gases, TMA is supplied to grow a AlAs layer having a predetermined thickness, and TMA and TMG are supplied to grow AlGaAs having a predetermined thickness. By alternately repeating this, the main DBR layer is formed. During a step of temporarily decreasing the substrate temperature of the GaAs substrate 11 to 630° C., which is lower than the growth temperature for the AlGaInP layer, which forms the light-emitting portion 13, at 730° C., the supply of the V group material gas AsH$_3$, the III group material gases TMG and TMA for the DBR layer is not stopped to continue the crystal growth of an AlGaAs layer to form it as the transition DBR layer.

Next, at the substrate temperature of 630° C., which is lower than the growth temperature for the AlGaInP layer, the V group material gas AsH$_3$ for the DBR layer is switched to a V group material gas PH$_3$ for the AlGaInP layer which forms the light-emitting portion 13. The supply of the III group material gases TMG and TMA for the DBR layer is stopped. The substrate temperature of the GaAs substrate 11 is increased to the preferable growth temperature for the AlGaInP layer, 730° C. During the temperature increasing step, 5 seconds after the switching from AsH$_3$ to PH$_3$, supply of III group material gases TMG, TMA and TMI for the AlGaInP layer, which forms the light-emitting portion 13, is started. As the AlGaInP layer is grown, the temperature is increased to the preferable growth temperature for the AlGaInP layer, which is 730° C. With the substrate temperature of the GaAs substrate 11 maintained at 730° C., crystal growth of the AlGaInP layer, which forms the light-emitting portion 13, is performed until it has a predetermined thickness.

In Example 4, as indicated by the left-hand side ⊙ in FIG. 7, at a point when the substrate temperature becomes a preferable temperature (for example, 630° C.) or higher during the temperature increasing step before the main GaAs buffer layer is formed, supply of the III group material gas, TMG, is started to grow the GaAs buffer layer 12. The GaAs buffer layer 12 is continuously grown until the temperature reaches the growth temperature for the GaAs buffer layer 12, which is 670° C.

Further, in Example 4, as indicated by the middle ⊙ FIG. 7, during the temperature increasing step between the growth of the main GaAs buffer layer and the DBR layer, supply of the III group material gas for the GaAs buffer layer, TMG, is not stopped, and the crystal growth of the GaAs buffer layer 12 is continued. The crystal growth of the GaAs buffer layer 12 is continuously performed until the temperature reaches the growth temperature for the DBR layer, which is 730° C.

Still further, in Example 4, as indicated by the right-hand side ⊙ in FIG. 7, during the temperature decreasing step for switching material gases between the main DBR layer and the light-emitting portion 13, supply of the III group material gases, TMG and TMA, for the AlGaAs layer which is grown to form the final layer of the main DBR layer is not stopped, and the crystal growth of the AlGaAs layer is continued. The crystal growth of the AlGaAs layer is continuously performed until the temperature reaches the substrate temperature, at 630° C.

As described above, as material gases to be supplied in the temperature increasing step and the temperature decreasing step, the same gas as the one which has been previously supplied is used. Thus, inconvenience of switching the material gases and irregularities in crystals generated at an interface due to the switching of the gasses can be prevented.

For growing the DBR layer, the material gases are required to be switched between the AlAs layer and the AlGaAs layer. Usually, when the material gases are switched, crystal growth is interrupted to allow for the time that the material gas takes to be evacuated from the reaction chamber 1. In Example 4, in order to prevent re-evaporated elements from attaching during the growth interruption, the crystal growth is not interrupted. It is not necessary to interrupt the crystal growth if there is no disturbance in the flow of the material gas in the reaction chamber 1, and the material gases are exchanged smoothly.

When the growth is interrupted for switching the material gases, time of growth interruption is kept short such that the influence thereof on the crystallinity is proportionally small. Thus, it is preferable to set the time of the growth interruption to 10 seconds or shorter.

In Example 4, for switching material gases between the DBR layer and the light-emitting portion 13, the time of the growth interruption during the temperature increasing step is shortened as much as possible, to 5 seconds. Thus, the crystallinity of the light-emitting portion 13 which is to be grown later is improved.

Using the III-V group compound semiconductor layer formed in Example 4, a semiconductor light-emitting diode was produced and the performance thereof was evaluated. The result shows that the luminance has improved by about 25% compared to the one produced without the supply of the III group material gas and thus without the crystal growth during the temperature decreasing step. The semiconductor laser as shown in FIG. 3B produced using this semiconductor layer also has improved crystallinity and performance.

EXAMPLE 5

In Example 5, unlike Examples 2 and 3, a DBR layer (optical reflection layer) is provided between a second GaAs buffer layer 12b and a AlGaInP layer which forms a light-emitting portion 13 of a semiconductor light-emitting element. The DBR layer reflects a part of the light emitting from the light-emitting portion 13, which heads toward a substrate, and directs this light to a light output surface opposing the substrate in order to improve an efficiency of light to be output. The main DBR layer can be formed by the crystal growth of AlAs layers and AlGaAs layers alternately repeated for 20 times at the same temperature as the growth temperature for the AlGaInP layer, which is 730° C.

Figure 8:
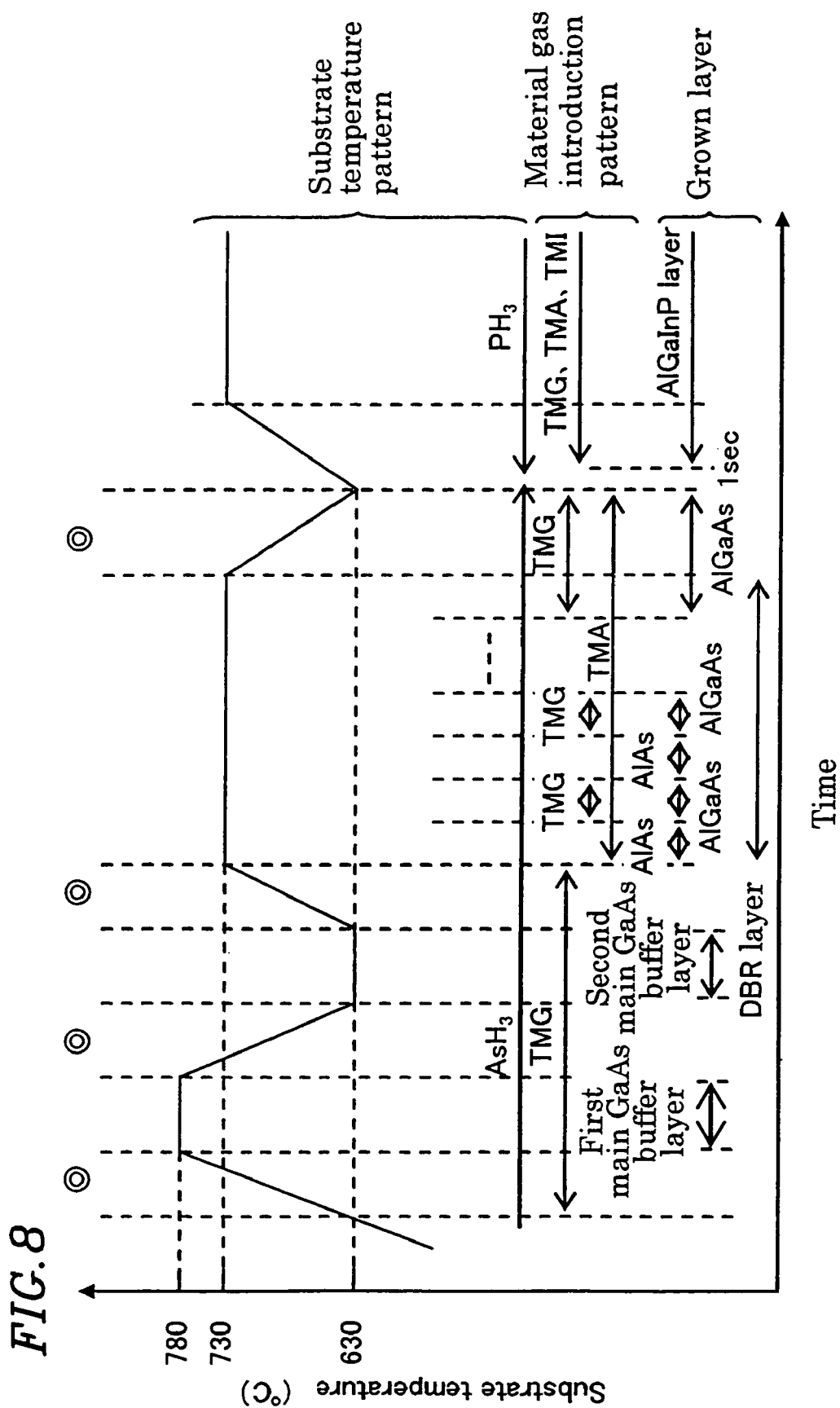
FIG. 8 is a diagram showing a pattern in substrate temperature and material gas introduction during the growth over time in a method for producing a III-IV group compound semiconductor layer of Example 5.
Figure 9:
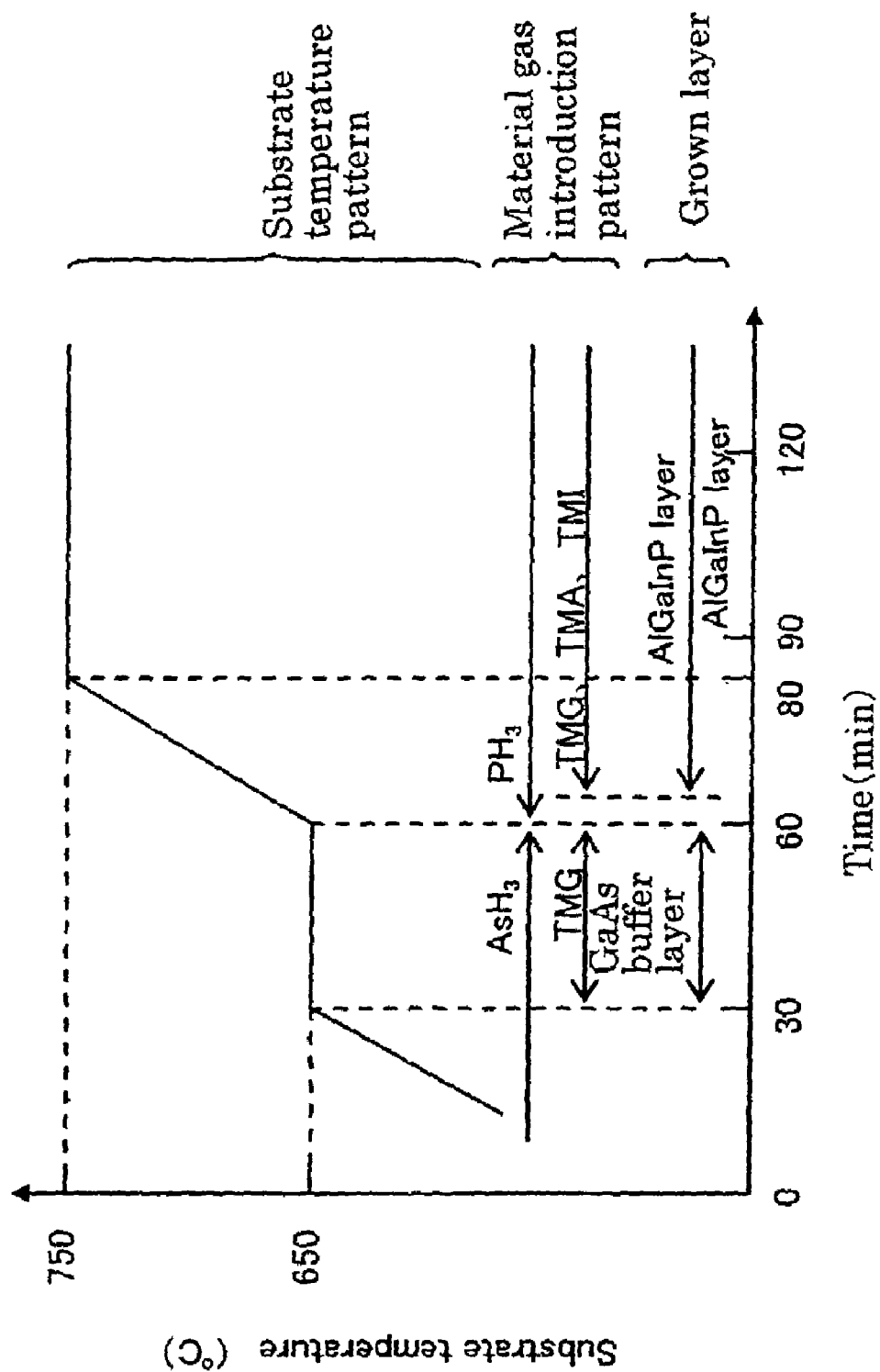
FIG. 9 is a diagram showing a pattern in substrate temperature and material gas introduction during the growth over time in a conventional method for producing a III-IV group compound semiconductor layer.
Figure 10:
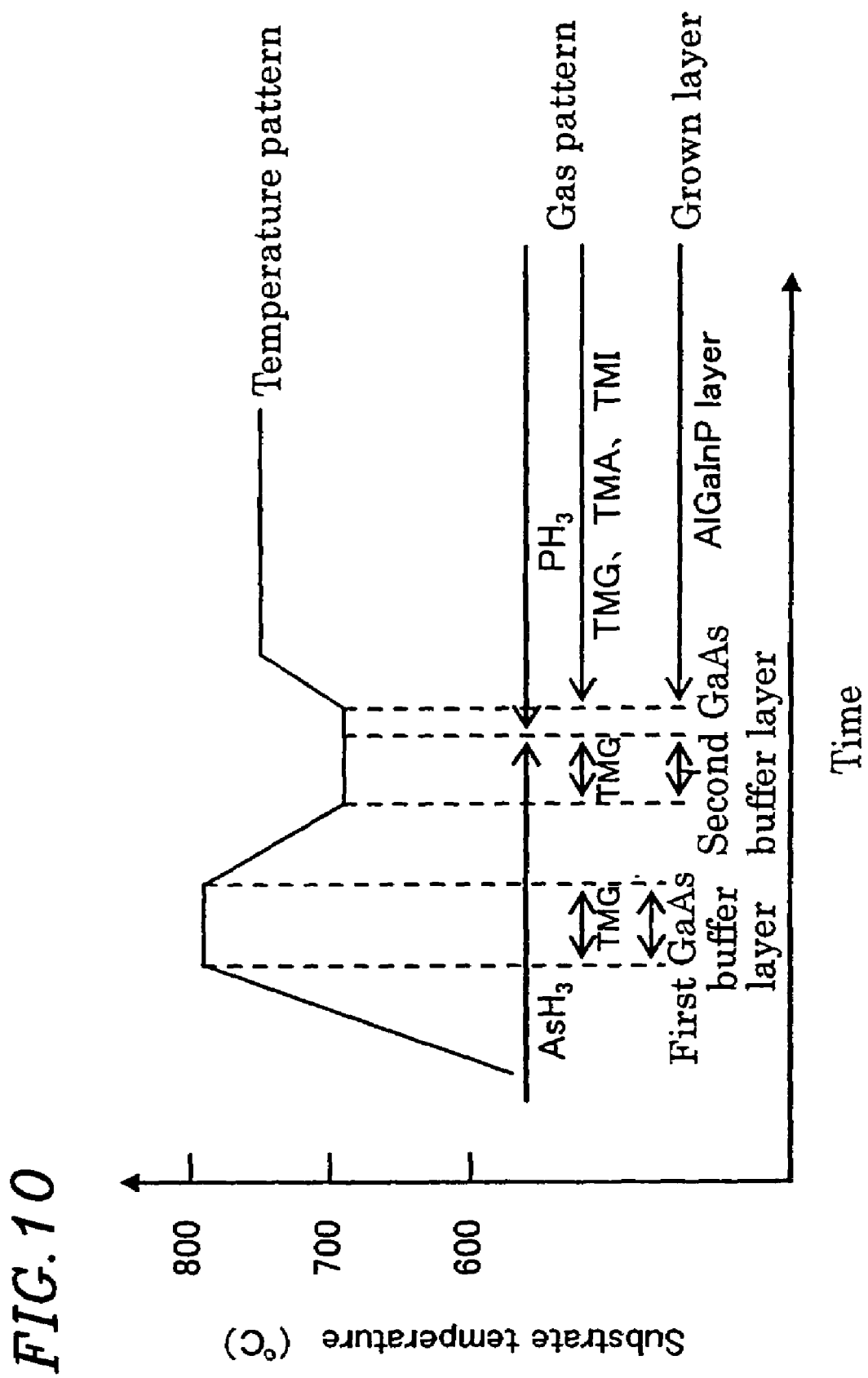
FIG. 10 is a diagram showing a pattern in substrate temperature and material gas introduction during the growth over time in a conventional method for producing a III-IV group compound semiconductor layer.
Figure 11A:
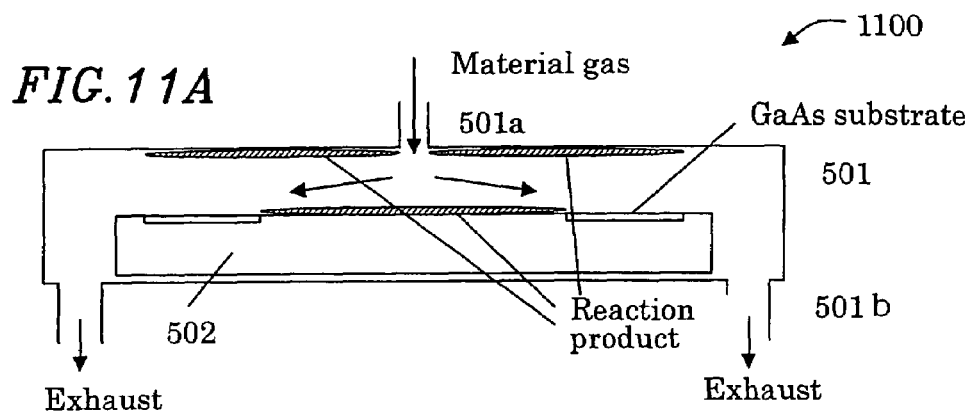
FIG. 11A is a cross-sectional view showing a structure of important parts of a vapor phase growing apparatus used in growing a III-V group compound semiconductor layer.
Figure 11B:
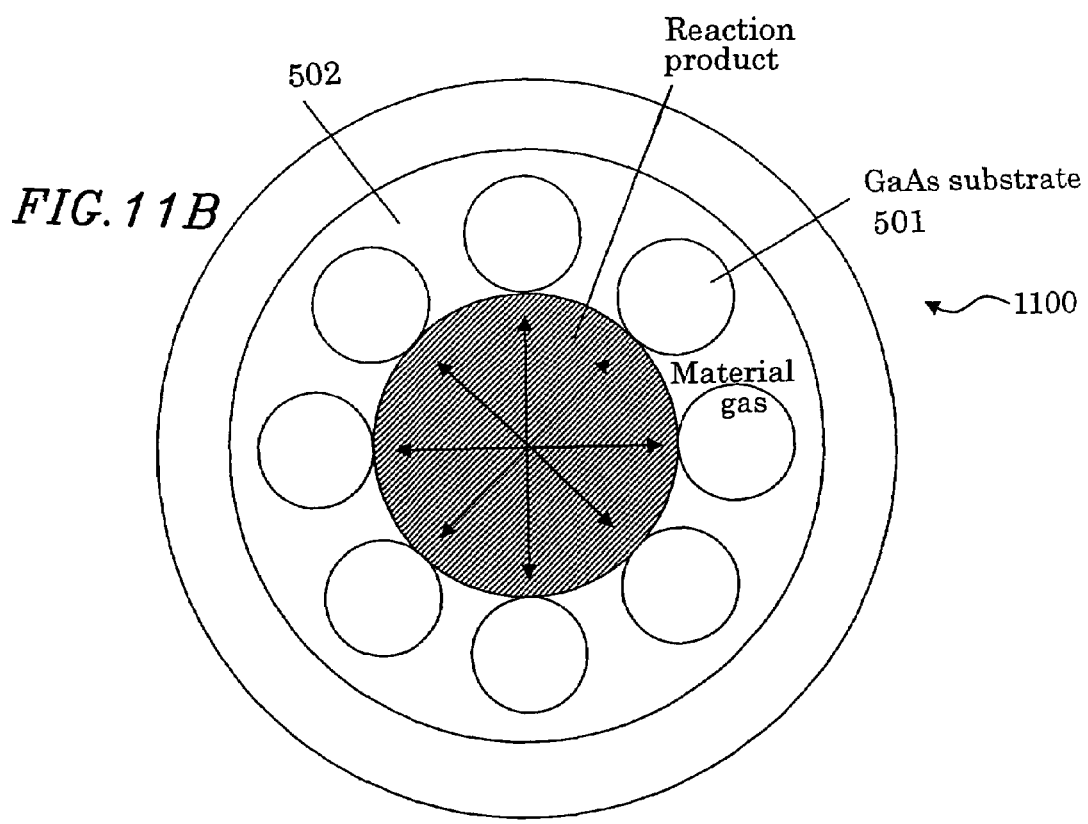
FIG. 11B is a plan view showing the vapor phase growing apparatus of FIG. 11A.

FIG. 8 is a diagram showing a pattern in substrate temperature and material gas introduction during the growth over time in a method for producing a III-IV group compound semiconductor layer of Example 5.

With reference to FIG. 8, first, a GaAs substrate 11 is placed on a substrate holding member 2 in a reaction chamber 1. The atmosphere in the reaction chamber 1 is reduced to desirable pressure. Then, as a V group material gas, AsH$_3$ is introduced into the reaction chamber 1. Next, during a step of increasing the substrate temperature of the GaAs substrate 11 to the growth temperature for the first GaAs buffer layer 12a, which is 780° C., at the point when the substrate temperature reaches a preferable temperature (for example, 630° C.), TMG is introduced into the reaction chamber 1 as a III group material gas to form a first transition GaAs buffer layer. As the crystal growth of the GaAs buffer layer 12 continues, the substrate temperature of the GaAs substrate 11 is increased to 780° C. With the substrate temperature maintained at 780° C. to form a first main buffer layer.

During a step of decreasing the substrate temperature of the GaAs substrate 11 to the growth temperature of the second GaAs buffer layer 12b, which is 630° C., the supply of the TMG to the reaction chamber 1 is not stopped and crystal growth of the GaAs buffer layer is continued to form a second transition GaAs buffer layer. As the crystal growth continues without an interruption, the substrate temperature of the GaAs substrate 11 is decreased to 630° C. With the substrate temperature maintained at 630° C. to form a second main GaAs buffer layer.

In a step of increasing the substrate temperature of the GaAs substrate 11 to the growth temperature for the DBR layer, which is 730° C., crystal growth is continued without stopping the supply of TMG to the reaction chamber 1 to form a third transition GaAs buffer layer. The crystal growth of the GaAs buffer layer 12 is performed. The GaAs buffer layer 12 includes the first transition GaAs buffer layer, the first main GaAs buffer layer, the second transition GaAs buffer layer, the second main GaAs buffer layer and the third transition GaAs buffer layer.

Next, at the growth temperature for the DBR layer, which is 730° C., as III group material gases, TMA is supplied to grow a AlAs layer having a predetermined thickness, and TMA and TMG are supplied to grow AlGaAs having a predetermined thickness. By alternately repeating this, the main DBR layer is formed. During a step of temporarily decreasing the substrate temperature of the GaAs substrate 11 to 630° C., which is lower than the growth temperature for the AlGaInP layer, which forms the light-emitting portion 13, which is 730° C., the supply of the V group material gas $AsH_3$, the III group material gases TMG and TMA for the DBR layer is not stopped to continue the crystal growth of the AlGaAs layer as a transition DBR layer.

Next, at the substrate temperature of 630° C., which is lower than the growth temperature for the AlGaInP layer, 730° C., the V group material gas $AsH_3$ for the DBR layer is switched to a V group material gas $PH_3$ for the AlGaInP layer which forms the light-emitting portion 13. The supply of the III group material gases TMG and TMA for the DBR layer is stopped. The substrate temperature of the GaAs substrate 11 is increased to the preferable growth temperature for the AlGaInP layer, which is 730° C. During the temperature increasing step, 1 second after the switching from $AsH_3$ to $PH_3$, supply of III group material gases TMG, TMA and TMI for the AlGaInP layer, which forms the light-emitting portion 13, are started. As crystal growth of the AlGaInP layer is continued, the temperature is increased to the preferable growth temperature for the AlGaInP layer, which is 730° C. With the substrate temperature of the GaAs substrate 11 maintained at 730° C., crystal growth of the AlGaInP layer, which forms the light-emitting portion 13, is performed until it has a predetermined thickness to form the AlGaInP layer.

In Example 5, as indicated by the left most ⊚ in FIG. 8, at a point when the substrate temperature becomes a preferable temperature (for example, 630° C.) or higher during the temperature increasing step before the first main GaAs buffer layer is formed, supply of the III group material gas, TMG, is started to effect crystal growth of the GaAs buffer layer. The first main GaAs buffer layer is continuously grown until the temperature reaches the growth temperature for the first main GaAs buffer layer, at 780° C.

Furthermore, in Example 5, as indicated by the middle left ⊚ in FIG. 8, during the temperature decreasing step between the growth of the first main GaAs buffer layer and the second main GaAs buffer layer, supply of the III group material gas, TMG, is not stopped, and the crystal growth of the GaAs buffer layer is continued. The crystal growth of the GaAs buffer layer is continuously performed until the temperature reaches the growth temperature for the second main GaAs buffer layer, at 630° C.

Further, in Example 5, as indicated by the middle right ⊚ in FIG. 8, during the temperature increasing step between the growth of the second main GaAs buffer layer and the DBR layer, supply of the III group material gas for the GaAs buffer layer, TMG, is not stopped, and the crystal growth of the GaAs buffer layer 12 is continued. The crystal growth of the GaAs buffer layer 12 is continuously performed until the temperature reaches the growth temperature for the DBR layer, at 730° C.

Still further, in Example 5, as indicated by the right most ⊚ in FIG. 8, during the temperature decreasing step for switching material gases between the main DBR layer and the light-emitting portion 13, supply of the III group material gases for the AlGaAs layer which is grown to form the final layer of the main DBR layer, TMG and TMA, is not stopped, and the crystal growth of the AlGaAs layer is continued to form a transition DBR layer. The crystal growth of the AlGaAs layer is continuously performed until the temperature reaches the substrate temperature, 630° C.

As described above, as material gases to be supplied in the temperature increasing step and the temperature decreasing step, the same gas as the one which has been previously supplied is used. Thus, inconvenience of switching the material gases and irregularities in crystals generated at an interface due to the switching of the gasses can be prevented.

For growing the DBR layer, the material gases are required to be switched between the AlAs layer and the AlGaAs layer. Usually, when the material gases are switched, growth is interrupted to allow for the time that the material gas takes to be evacuated from the reaction chamber 1. In Example 5, in order to prevent re-evaporated elements from attaching during the growth interruption, the crystal growth is not interrupted. It is not necessary to interrupt the crystal growth if there is no disturbance in the flow of the material gas in the reaction chamber 1 and the material gases are exchanged smoothly.

When the growth is interrupted for switching the material gases, time of growth interruption is kept short such that the influence thereof on the crystallinity is proportionally small. Thus, it is preferable to set the time of the growth interruption to 10 seconds or shorter.

In Example 5, for switching material gases between the DBR layer and the light-emitting portion 13, the time of the growth interruption during the temperature increasing step is shortened as much as possible, to 1 second. Thus, the crystallinity of the light-emitting portion 13 which is to be grown later is improved.

Using the III-V group compound semiconductor layer formed in Example 5, a semiconductor light-emitting diode was produced and the performance thereof was evaluated. The result shows that the luminance has improved by about 25% compared to the one produced without the supply of the III group material gas and thus without the crystal growth during the temperature decreasing step. The semiconductor laser as shown in FIG. 3B produced using this semiconductor layer also has improved crystallinity and performance.

As described above, for growing a semiconductor layer with a material gas being supplied to a reaction chamber 1, reaction products attached on an upstream side of a substrate re-evaporate when the substrate is heated during the steps afterward and mix into material gases, thereby causing adverse influences on the crystallinity. An amount of re-evaporation increases as growth temperature increases. On the other hand, if the growth temperature is too low, crystal defects are generated due to insufficiency in migration. At a preferable temperature (for example, 630° C.), the number of crystal defects can be the smallest. Therefore, in crystal growth of a III-V group compound semiconductor layer at a predetermined substrate temperature according to Examples 1 through 5 of the present invention, during a temperature increasing step before the start of crystal growth and/or a growth interruption step for switching compositions, a III group material gas is supplied to the reaction chamber 1 when the substrate temperature is the preferable temperature (for example, 630° C.) or higher to continue the crystal growth. Thus, it is possible to suppress deterioration in the crystallinity of the III-V group compound semiconductor layer due to re-evaporation of the reaction products attached around the substrate holding member 2 in the reaction chamber 1.

As will be appreciated from the above descriptions, according to the present invention, in crystal growth of a III-V group compound semiconductor layer at a predetermined substrate temperature, growth is continued without an interruption with a III group material gas being supplied to a reaction chamber when substrate temperature is a preferable temperature (for example, 630° C.) or higher. Thus, re-evaporated elements such as As, In, or the like from reaction products attached around a substrate holding member can be prevented from accumulating on a substrate surface and a growth interface and being incorporated therein. Accordingly, it is possible to obtain crystals having good quality.

Further, according to the present invention, supply of a III group material gas to the reaction chamber is started when a substrate temperature becomes a preferable temperature (for example, 630° C.) or higher during a temperature increasing step before growth of a semiconductor layer. Thus, re-evaporated elements such as As, In, or the like from reaction products attached around a substrate holding member in an initial stage of the growth can be prevented from accumulating on a substrate surface and a growth interface and being incorporated therein. Accordingly, it is possible to obtain crystals having good quality.

Still further, according to the present invention, a III group material gas is supplied to a reaction chamber during a temperature increasing step or a temperature decreasing step between growth of different growth layers to continue the growth without an interruption between the growth of different growth layers. Thus, In, As and the like are not accumulated on an interface between growth layers and defects of high density are not formed. Accordingly, it is possible to obtain crystals having good quality.

Still further, according to the present invention, for growing a GaAs buffer layer on a GaAs substrate, supply of a III group material gas to the reaction chamber is started when a substrate temperature becomes a preferable temperature (for example, 630° C.) or higher during a temperature increasing step to the growth temperature for the GaAs buffer layer. Thus, re-evaporated elements such as As, In, or the like from reaction products attached around a substrate holding member in an initial stage of the growth can be prevented from accumulating on a substrate surface and a growth interface and being incorporated therein. Accordingly, it is possible to obtain crystals having good quality.

Moreover, as the III group material gas supplied to the reaction chamber in the temperature increasing step to the growth temperature for a GaAs buffer layer to be grown first, the same gas as the III group material gas used for growth of the GaAs buffer layer is used. Thus, inconvenience of switching the material gases is eliminated. Also, a disturbance in crystals generated at an interface due to the switching of the material gasses can be prevented. Accordingly, it is possible to obtain crystals having good quality.

Still further, according to the present invention, for growing two GaAs buffer layers having different growth temperatures on a GaAs substrate, a III group material gas is supplied to a reaction chamber during a temperature increasing step or a temperature decreasing step between growth of different growth layers to continue the growth without an interruption between the growth of different growth layers. Thus, In, As and the like are not accumulated on an interface between growth layers and defects of high density are not formed. Accordingly, it is possible to obtain crystals having good quality.

Moreover, as the III group material gas supplied to the reaction chamber in the temperature increasing step or the temperature decreasing step, the same gas as the III group material gas used for growth of a GaAs buffer layer is used. Thus, the inconvenience of switching the material gases is eliminated. Also, a disturbance in crystals generated at an interface due to the switching of the material gasses can be prevented. Accordingly, it is possible to obtain crystals having good quality.

Moreover, the growth temperature for at least one of the GaAs buffer layers is set to be higher than the growth temperature for a III-V group compound semiconductor to be grown on the GaAs buffer layer. Thus, it is possible to evaporate oxygen attached to a substrate holding member and the like during the growth of the GaAs buffer layer. In this case, since the growth temperature is high, an amount of re-evaporation of reaction products attached around the substrate holding member becomes large. If the growth is interrupted before or after such re-evaporation, an adverse effect on the crystallinity becomes significant. Therefore, in the case of growing at least one of the GaAs buffer layers at a high temperature, it is preferable to supply the III group material gas to the reaction chamber in the temperature increasing step or the temperature decreasing step performed before and after to continue the growth.

Moreover, for switching material gases in order to change the composition of growth layers, supply of the III group material gas may be stopped temporarily to interrupt the growth. In such a case, it is preferable to set the interruption to be 10 seconds or shorter. It is preferable not to interrupt the growth of the semiconductor layer. However, in the case when it is necessary to provide the growth interruption, accumulation of In, As and the like on a growth interface during the growth interruption can be suppressed to a minimum by setting the time to 10 seconds or shorter.

The present invention is particularly effective when $(Al_xGa_{1-x})_yIn_{1-y}P$ ($0 \leq x \leq 1$, $0 \leq y < 1$)) is included as a III-V group compound semiconductor. Generally, for growing a AlGaInP family semiconductor layer, a GaAs buffer layer is provided on a GaAs substrate, and then, an AlGaInP layer is grown thereon. Thus, As and In are included in the reaction products. Accordingly, the quality of the crystals can be improved by using the method for producing a III-V group compound semiconductor layer of the present invention.

Moreover, in the case when a metal organic chemical vapor deposition is used as the method for producing, since the material to be supplied is gas, it is effective to the method for producing a III-V group compound semiconductor layer of the present invention and the quality of the crystals can be improved.

The larger the amount the reaction products attached around the substrate holding member, the more effective the present invention. Particularly, for producing a semiconductor light-emitting diode, a thickness of the layer to be grown at each step is thicker than that for producing other types of semiconductor light-emitting elements such as a semiconductor laser. Thus, amounts of the reaction products attached around the substrate holding member are larger. Accordingly, the present invention is particularly effective when applied to production of a semiconductor light-emitting diode and achieves a large effect such as improvement in luminance caused by improvement in the quality of crystals.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a III-V group compound semiconductor layer, comprising the steps of:
    forming a first III-V group compound semiconductor layer on a substrate in a reaction chamber; and
    supplying a III group material gas to the reaction chamber before and after the step of forming the first III-V group compound semiconductor layer to prevent re-evaporation of the III group gas in the reaction chamber wherein the III group material gas is supplied when a substrate temperature becomes a preferable temperature or higher.

2. A method for producing a III-V group compound semiconductor layer according to claim 1, wherein the step of supplying the III group material gas includes a step of forming a first transition III-V group compound semiconductor layer by supplying the III group material gas.

3. A method for producing a III-V group compound semiconductor layer according to claim 1, wherein the step of forming the first III-V group compound semiconductor layer includes a step of forming the first III-V group compound semiconductor layer at a first substrate temperature.

4. A method for producing a III-V group compound semiconductor layer according to claim 3, further comprising a step of forming a second III-V group compound semiconductor layer at a second substrate temperature in the reaction chamber,
    wherein the step of supplying the III group material gas includes a step of supplying the III group material gas while the substrate temperature changes from the first substrate temperature to the second substrate temperature.

5. A method for producing a III-V group compound semiconductor layer according to claim 4, wherein the step of supplying the III group material gas includes a step of supplying a V group material gas with the III group material gas while the substrate temperature changes from the first substrate temperature to the second substrate temperature.

6. A method for producing a III-V group compound semiconductor layer according to claim 4, wherein the step of forming the second III-V group compound semiconductor layer includes a step of forming a second III-V group compound semiconductor layer using the III group material gas after stopping the III group material gas for 10 seconds or shorter.

7. A method for producing a III-V group compound semiconductor layer according to claim 4, wherein:
    the substrate is a GaAs substrate;
    the step of forming the first III-V group compound semiconductor layer includes a step of forming a first GaAs buffer layer at the first substrate temperature on the GaAs substrate;
    the step of forming the second III-V group compound semiconductor layer includes a step of forming a second GaAs buffer layer at the second substrate temperature; and
    the step of supplying the III group material gas includes a step of supplying the III group material gas while the substrate temperature changes from the first substrate temperature to the second substrate temperature.

8. A method for producing a III-V group compound semiconductor layer according to claim 7, wherein the step of supplying the III group material gas includes a step of supplying a III group material gas used in at least one of the steps of forming the first GaAs buffer layer and the step of forming the second GaAs buffer layer as the III group material gas.

9. A method for producing a III-V group compound semiconductor layer according to claim 7, further comprising a step of forming a third III-V group compound semiconductor layer at a substrate temperature higher than at least one of the first substrate temperature and the second substrate temperature in the reaction chamber.

10. A method for producing a III-V group compound semiconductor layer according to claim 1, wherein the preferable temperature is a substrate temperature at which crystal defects including crystal defects due to re-evaporation of reaction products produced in the reaction chamber and crystal defects due to insufficiency of migration are minimal.

11. A method for producing a III-V group compound semiconductor layer according to claim 10, wherein the step of supplying the III group material gas includes a step of supplying the III group material gas when the substrate temperature becomes the preferable temperature or higher before the step of forming the first III-V group compound semiconductor layer is finished.

12. A method for producing a III-V group compound semiconductor layer according to claim 10, wherein the step of supplying the III group material gas includes a step of supplying the III group material gas when the substrate temperature becomes the preferable temperature or higher while the substrate temperature increases to a first substrate temperature before the step of forming the first III-V group compound semiconductor layer.

13. A method for producing a III-V group compound semiconductor layer according to claim 12, wherein the step of supplying the III group material gas includes a step of supplying a V group material gas with the III group material gas when the substrate temperature becomes the preferable temperature or higher while the substrate temperature increases to the first substrate temperature.

14. A method for producing a III-V group compound semiconductor layer according to claim 10, wherein:
    the substrate is a GaAs substrate;
    the step of forming the first III-V group compound semiconductor layer includes a step of forming a GaAs buffer layer on the GaAs substrate at a first substrate temperature;
    the step of supplying the III group material gas includes a step of supplying the III group material gas when the substrate temperature becomes the preferable temperature or higher while the substrate temperature increases to the first substrate temperature.

15. A method for producing a III-V group compound semiconductor layer according to claim 14, wherein the step of supplying the III group material gas includes a step of supplying a III group material gas used in the step of forming the GaAs buffer layer as the III group material gas.

16. A method for producing a III-V group compound semiconductor layer according to claim 14, further comprising a step of forming an $(Al_xGa_{1-x})_yIn_{1-y}P$ layer ($0 \leq x<1$, $0 \leq y<1$) on the GaAs buffer layer.

17. A method for producing a III-V group compound semiconductor layer according to claim 16, wherein:
the step of forming the GaAs buffer layer includes a step of forming the GaAs buffer layer at the first substrate temperature using a first V group material gas; and
the step of forming the $(Al_xGa_{1-x})_yIn_{1-y}P$ layer ($0x \leq 1$, $0 \leq y<1$) includes a step of for $(Al_xGa_{1-x})_yIn_{1-y}P$ layer ($0 \leq x \leq 1$, $0y<1$) at a second substrate temperature using a second V material gas,
further comprising a step of switching the first V group material gas to the second V group material gas at a substrate temperature lower than the second substrate temperature.

18. A method for producing a III-V group compound semiconductor layer according to claim 1, wherein the first III-V group compound semiconductor layer includes at least one of In and As.

19. A method for producing a III-V group compound semiconductor layer according to claim 1, wherein the step of forming the first III-V group compound semiconductor layer includes a step of forming the first III-V group compound semiconductor layer using a metal organic chemical vapor deposition.

20. A method for producing a III-V group compound semiconductor layer according to claim 1, wherein the preferable temperature is 600° C.

21. A method for producing a III-V group compound semiconductor layer according to claim 1, wherein the preferable temperature is 630° C.

22. A method for producing a semiconductor light-emitting element comprising:
a step of producing a III-V group compound semiconductor layer; and
a step of forming a semiconductor light-emitting element using the III-V group compound semiconductor layer, wherein:
the step of producing the III-V group compound semiconductor layer includes the steps of:
forming a III-V group compound semiconductor layer on a substrate in a reaction chamber; and
supplying a III group material gas to the reaction chamber before and after the step of forming the III-V group compound semiconductor layer to prevent re-evaporation of the III group gas in the reaction chamber wherein the III group material gas is supplied when a substrate temperature becomes a preferable temperature or higher.

23. A method for producing a semiconductor light-emitting element according to claim 22, wherein the step of forming the semiconductor light-emitting element includes a step of forming a semiconductor light-emitting diode or a semiconductor laser.

* * * * *